(12) United States Patent
Sato

(10) Patent No.: US 6,171,982 B1
(45) Date of Patent: Jan. 9, 2001

(54) METHOD AND APPARATUS FOR HEAT-TREATING AN SOI SUBSTRATE AND METHOD OF PREPARING AN SOI SUBSTRATE BY USING THE SAME

(75) Inventor: Nobuhiko Sato, Sagamihara (JP)

(73) Assignee: Canon Kabushiki Kaisha, Tokyo (JP)

( * ) Notice: Under 35 U.S.C. 154(b), the term of this patent shall be extended for 0 days.

(21) Appl. No.: 09/218,416

(22) Filed: Dec. 22, 1998

(30) Foreign Application Priority Data

Dec. 26, 1997 (JP) .................................................. 9-361571

(51) Int. Cl.$^7$ ......................... H01L 21/26; H01L 21/324; H01L 21/726

(52) U.S. Cl. .................................. 438/795; 432/5; 432/6; 432/200

(58) Field of Search ................................ 438/795; 432/5, 432/6, 200

(56) References Cited

U.S. PATENT DOCUMENTS

| 5,310,689 | 5/1994 | Tomozane et al. | 437/24 |
|---|---|---|---|
| 5,371,037 | 12/1994 | Yonehara | 437/86 |
| 5,374,564 | 12/1994 | Bruel | 437/24 |
| 5,427,055 | 6/1995 | Ichikawa | 117/92 |
| 5,484,484 | 1/1996 | Yamaga et al. | 118/719 |
| 5,869,387 | 2/1999 | Sato et al. | 438/459 |

FOREIGN PATENT DOCUMENTS

| 0 553 852 | 8/1993 | (EP) | H01L/21/76 |
|---|---|---|---|
| 5-211128 | 8/1993 | (JP) . | |
| 5-217821 | 8/1993 | (JP) . | |
| 5-218053 | 8/1993 | (JP) . | |

OTHER PUBLICATIONS

K. Izumi, et al., "C.M.O.S. Devices Fabricated on Buried SiO$_2$ Layers Formed by Oxygen Implantation Into Silicon", Electronics Letters, vol. 14, No. 18, pp. 593–594 (1978).

S. Nakashima, et al., "Surface Morphology of Oxygen–Implanted Wafers", J. Mater. Res., vol. 5, No. 9, pp. 1918–1928 (1990).

L.Y. Lin, et al., "Micromachined Integrated Optics for Free–Space Interconnections", IEEE Micro Electro Mechanical Systems Proc., pp. 77–82 (1995).

T. Yonehara, et al., "Epitaxial Layer Transfer By Bond and Etch Back of Porous Si", Appl. Phys. Lett., vol. 64, No. 16, pp. 2108–2110 (1994).

Y. Hayashi, et al., "Record Low–Threshold Index–Guided In GaAs/GAAlAs Vertical–Cavity Surface–Emitting Laser With A Native Oxide Confinement Structure", Electronics Letters, vol. 31, No. 7, pp. 560–562 (1995).

N. Sato et al., "Hydrogen annealed silicon–on–insulator", Appl. Phys. Lett., vol. 65, No. 15, pp. 1924–1926 (1994).

B.M. Gallois et al., "Chemical Etching of Silicon (100) by Hydrogen", J. Am. Ceram. Soc., vol. 77, No. 11, pp. 2949–2952 (1994).

L. Zhong et al., "Outdiffusion of impurity atoms from silicon crystals and its dependence upon the annealing atmosphere", Appl. Phys. Lett., vol. 68, No. 9, pp. 1229–1231 (1996).

Primary Examiner—Charles Bowers
Assistant Examiner—Erik Kielin
(74) Attorney, Agent, or Firm—Fitzpatrick, Cella, Harper & Scinto

(57) ABSTRACT

An SOI substrate having on the surface thereof a single crystal silicon film formed on an insulator is heat-treated in a hydrogen-containing reducing atmosphere in order to smooth the surface and reduce the boron concentration without damaging the film thickness uniformity in a single wafer and among different wafers. The method is characterized in that the single crystal silicon film is arranged opposite to a member of non-oxidized silicon for heat treatment.

30 Claims, 12 Drawing Sheets

FIG. 13A (S21)
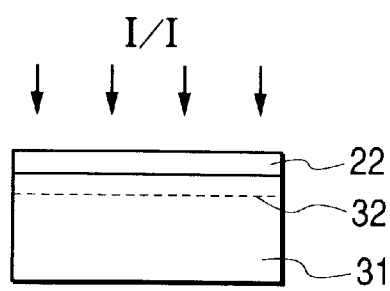
FIG. 13B (S22)
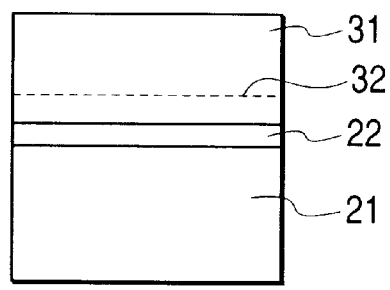
FIG. 13C (S23)
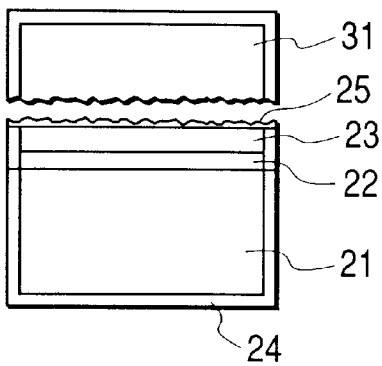
FIG. 13D (S24)
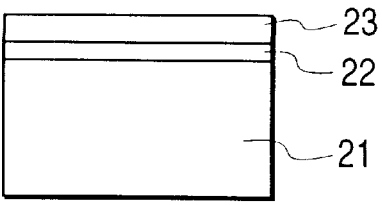

(S31)

(S32)

(S33)

(S34)

(S35)

(S36)

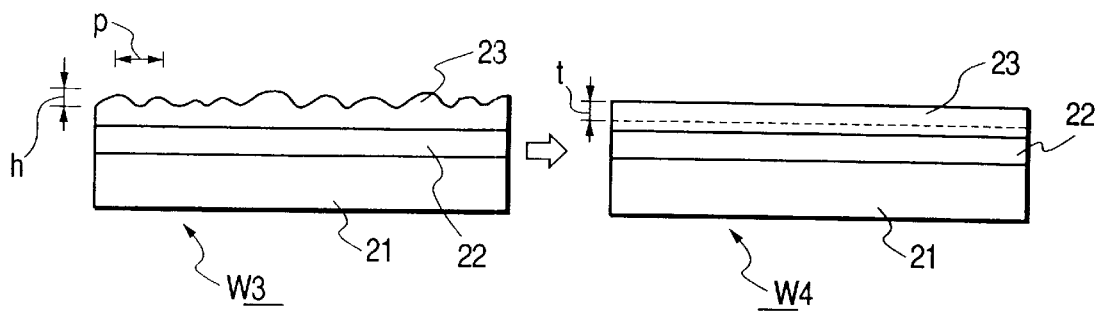
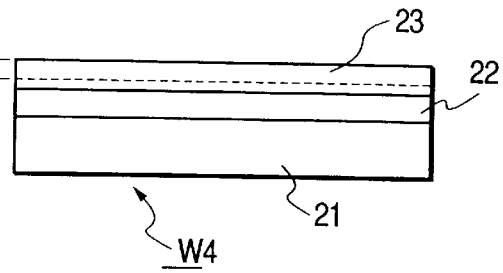
FIG. 15A  FIG. 15B
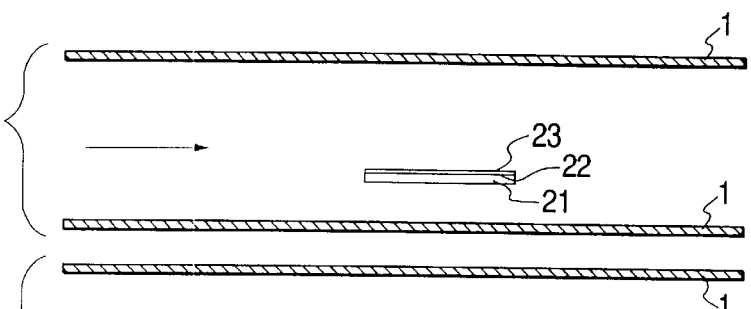
FIG. 16A
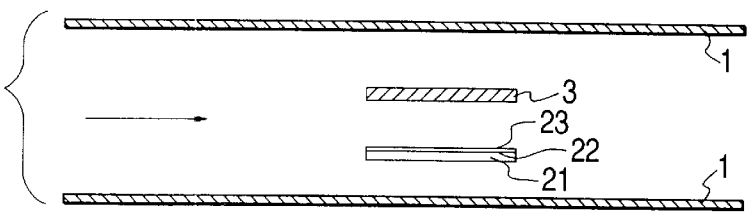
FIG. 16B
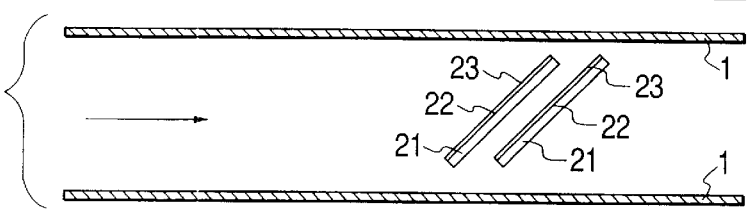
FIG. 16C
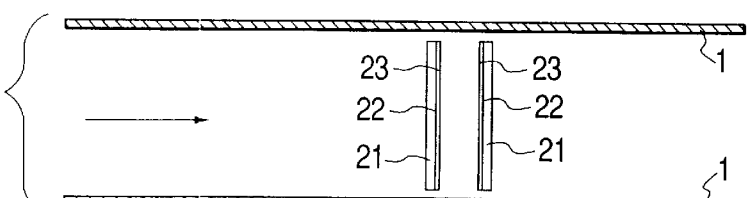
FIG. 16D
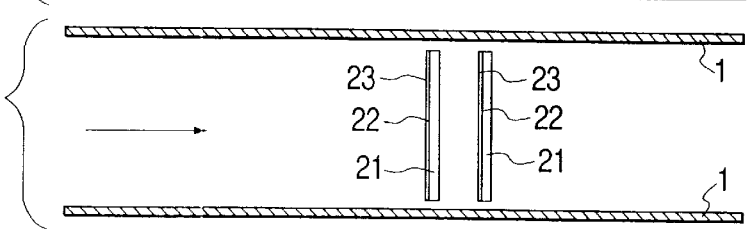
FIG. 16E

METHOD AND APPARATUS FOR HEAT-TREATING AN SOI SUBSTRATE AND METHOD OF PREPARING AN SOI SUBSTRATE BY USING THE SAME

BACKGROUND OF THE INVENTION

1. Field of the Invention

This invention relates to a method and an apparatus for heat-treating an SOI substrate and also to a method of preparing an SOI substrate using the same. More particularly, the present invention relates to a method and an apparatus for heat-treating an SOI subsrate having a silicon film, and also to a method of preparing an SOI substrate using the same.

2. Related Background Art

In the technological field of silicon type semiconductor devices and integrated circuits, much research has been conducted to date on devices having a semiconductor on insulator (SOI) structure produced by utilizing a single crystal semiconductor film formed on a film insulator because such devices provide a reduced parasitic capacitance, an improved resistance against radiation and an easy device isolation; these features which can lead to a high speed/low voltage operation of transistors, a low power consumption rate, an enhanced degree of adaptability to integration and a significant reduction in the number of manufacturing steps including elimination of the well-producing steps.

Known substrates having an SOI structure (SOI substrates) include SOS (silicon on sapphire) substrates, those prepared by oxidizing the surface of an Si single crystal substrate, forming an window to expose part of the Si substrate and realizing a lateral epitaxial growth by using that area as seed to form a Si single crystal film (layer) on the $SiO_2$ surface, those prepared by using a Si single crystal substrate itself as an active layer and forming a silicon oxide film thereunder, those prepared by using a substrate having a dielectrically isolated Si single crystal region on a thick poly-crystalline Si layer and surrounded by a V-shaped groove and SOI substrates prepared by means of dielectric isolation involving oxidation of porous Si, which is referred to as FIPOS (full isolation by porous silicon).

Recently, SIMOX (separation by implanted oxygen) technology and wafer bonding technology have been in the main stream of SOI structure production technology. The SIMOX technology was reported for the first time in 1978 (K. Izumi, M. Doken and H. Ariyoshi, Electron. Lett. 14 (1978) p.593). It provides a method of forming a buried silicon oxide film by implanting oxygen ions into a silicon substrate and subsequently heat-treating it at high temperature.

The wafer bonding technology provides, on the other hand, a variety of techniques for thinning one of the bonded wafers in the process of producing an SOI structure.

BPSOI

This is one of the most basic processes that utilizes polishing. A silicon oxide film is formed on the surface of one or both of a pair of wafers, which are bonded together. Subsequently, one of the wafers is thinned by grinding and polishing.

PACE

The plasma assisted chemical etching (PACE) process was developed to improve the uniformity of film thickness of an SOI layer obtained by polishing. With this technique, the film thickness is measured at thousands of highly densely distributed measuring points on the wafer. Then, a plasma source having a diameter of several millimeters is driven to scan the film at a scanning rate corresponding to the film thickness to vary the etching rate as a function of the film thickness distribution and thereby reduce the variations in the film thickness.

Cleave Process using Hydrogen Ion Implantation

A novel technique for producing a bonded SOI substrate was recently reported by M. Bruel in Electronics Letters, 31 p. 1201 (1995) and also disclosed in Japanese Patent Application Laid-Open No. 5-211128 and U.S. Pat. No. 5,374,564. With this process, an oxidized wafer that has been implanted with ions of a light element such as hydrogen or an inert gas element over the entire surface thereof is bonded to another wafer and subsequently heat-treated. Then, the wafer is cleaved during the heat treatment at the depth to which ions have been implanted. As a result, the layer located above the projection range of implanted ions is transferred onto the other wafer to produce an SOI structure.

Epitaxial Layer Transfer

Japanese Patent No. 2608351 and U.S. Pat. No. 5,371,037 describe an excellent technique for preparing an SOI substrate by transferring a single crystal layer on a porous layer onto another substrate. This technique is also referred to as "ELTRAN (registered tradename)" (T. Yonehara, K. Sakakguchi, N. Sato, Appl. Phys. Lett., 64 p. 2108 (1994)).

As discussed above, in the field of SOI substrates, smoothing the rough surface produced as a result of etching, ion implantation and subsequent heat treatment and forming an SOI layer of silicon film with a low boron concentration by partly removing boron atoms diffused into the single crystal layer are the major problems that have to be solved to improve the withstand voltage of the gate oxide film and the carrier mobility of MOSFET in order to improve the performance of silicon type semiconductor devices. Thus, various techniques have been proposed to solve these problems for each of the above-listed methods for preparing SOI substrates.

With the cleave process using hydrogen ion implantation, the surface of the wafer separated along the ion projection range shows a root-mean-square of surface roughness (Rrms) of 10 nm, and the surface layer has damage caused by ion implantation. Such a wafer is smoothed to remove the layer damaged by ion implantation by polishing and removing the surface layer to a small extent using a technique referred to as "touch polishing" (M. Bruel, et al., Proc. 1995 IEEE Int. SOI Conf., p. 178 (1995)).

With the PACE technique, the surface roughness up to 10.66 nm (as peak-to-valley value) is detected by means of an atomic force microscope immediately after the plasma etching process. Such a rough surface is then smoothed to 0.62 nm, or to the level equivalent to the original surface roughness, by touch polishing for removing the surface only to a slight extent (T. Feng, M. Matloubian, G. J. Gardopee, and D. P. Mathur, Proc. 1994 IEEE Int. SOI Conf., p. 77 (1994)).

When the BESOI technique is used, the surface roughness of about 5 to 7 nm peak to valley produced at the end of the etching process is removed only by removing the surface layer by three to five times of the surface roughness or by 20 to 30 nm. As a result of this polishing process, the uniformity of film thickness is degraded by 0.005 $\mu$m (=5 nm) on average.

Thus, when touch polishing or kiss polishing, as it is often called, is used to polish the surface only to a slight extent, the surface roughness may be removed. However, at the same time, the film thickness will be reduced to consequently degrade the uniformity of film thickness. While the polishing operation is terminated generally by controlling the duration of the operation, it is a known fact that, if the polishing time is constant, the extent of polishing varies within the same surface of a wafer, among the surfaces of different wafers and from batch to batch depending on the polishing solution, the temperature of the surface table during the polishing operation and how much the emery cloth is worn. Hence it is very difficult to keep the extent of polishing to a constant level. Particularly, it is known that the wafer is normally polished more along the outer periphery.

Additionally, it is impossible to reduce the boron concentration if boron is diffused across the entire depth of the SOI layer to show a high concentration level. The surface roughness of the SOI layer of a wafer prepared by the SIMOX technique using oxygen ion implantation is greater than that of the bulk normally by a digit. S. Nakashima and K. Izumi (J. Mater. Res., vol. 5, no. 9, p. 1918 (1990)) reported that the surface roughness with innumerable recesses having a diameter of tens of several nanometers can be eliminated by heat-treating the surface at 1260° C. (in a nitrogen atmosphere) for 2 hours or at 1300° C. (in an argon atmosphere containing oxygen by 0.5%) for 4 hours. They also reported that the surface roughness will not change by heat treatment at 1150° C. However, it is practically impossible to use a quartz tube for a heat treatment conducted at temperatures higher than 1200° C. in terms of thermal resistance. Additionally, a process using such high temperature makes the introduction of slip lines serious as the wafer size increases.

With the oxygen implantation technique, there may arise a problem that boron atoms contained in the clean room adhere to the surface of the substrate and implant into the wafer during implantation of oxygen ions (co-implantation). It is also problematic that the boron atoms that have adhered to the wafer before the high temperature heat treatment process for turning the oxygen contained in the wafer by ion implantation into a silicon oxide layer can be diffused into the entire silicon layer by the heat treatment. A similar problem may be produced in a bonded SOI substrate by boron atoms contained in the clean room.

The inventors of the present invention proposed in Japanese Patent Applications Laid-Open Nos. 5-218053 and 5-217821 a technique for smoothing the surface of an SOI substrate by heat-treating it in a hydrogen-containing atmosphere.

The surface of an SOI substrate that may carry undulations after the etching process and hence is rougher than the polished surface of a commercially available silicon wafer can be smoothed by hydrogen annealing to a level of smoothness comparable to the polished surface of such a commercially available silicon wafer. At the same time, the boron concentration of the single crystal silicon film can be reduced by annealing the substrate having a single crystal silicon film formed on an insulator in a hydrogen atmosphere and externally diffusing boron into the gas phase. While the rate of diffusion of boron is relatively high in silicon, it is low in a naturally oxidized silicon oxide layer that is typically formed on the surface of the substrate during a heat treatment process conducted in an oxygen or inert gas atmosphere so that boron will remain and be confined within the silicon layer. However, the silicon oxide film formed on the surface of the SOI layer and operating as a diffusion barrier can be removed, and any possible subsequent formation of oxide film during the process can be effectively suppressed by annealing the substrate in a reducing atmosphere typically containing hydrogen so that, as a result, the external diffusion of boron is encouraged and, if boron is contained in the entire SOI layer to a high concentration level, the impurity concentration of the entire SOI layer can be reduced to a level that is feasible for device fabrication by that external diffusion of boron (N. Sato and T. Yonehara, Appl. Phys. Lett., 65 p. 1924 (1994)).

Thus, a heat treatment in a hydrogen-containing atmosphere is a highly effective way for externally diffusing boron contained in the silicon layer and smoothing the surface thereof showing a remarkable degree of roughness.

A heat treatment in a hydrogen-containing atmosphere is also highly effective for preparing an SOI substrate by means of the SIMOX technique. The above paper also reports that the surface roughness can be smoothed satisfactorily by heat treatment conducted at or below 1200° C. in a hydrogen-containing atmosphere.

When annealing an SOI substrate using hydrogen, the rate of reduction of the film thickness will be 0.08 nm/min. at 1150° C., which is much lower than the rate of reduction by polishing. However, when annealing a bulk wafer in place of an SOI substrate using hydrogen, a relatively high rate of reduction of 10 to 100 nm/min. in the film thickness is reported by B. M. Gallois et al., J. Am. Ceram. Soc., 77 p. 2949 (1994). It will be appreciated that the uniformity of film thickness is apt to be degraded in same wafer surface and among the surfaces of different wafers when the rate of film thickness reduction and the etching rate are not controlled properly.

Thus, it is very important to precisely control the film thickness for each wafer and among different wafers, because noticeable variations in the film thickness of the SOI layer can significantly affect the performance of the devices produced as final products, particularly in terms of characteristics including the threshold voltage of a fully depleted type SOI-MOS transistor.

There are requirements for an SOI substrate other than the uniformity of film thickness.

The film thickness of the SOI layer varies depending on the characteristics of the semiconductor device to be produced using the SOI substrate. From the viewpoint of designing SOI substrates, it is preferred that the film thickness of the SOI layer of the SOI substrate does not fluctuate with heat treatment.

SUMMARY OF THE INVENTION

Thus, it is an object of the present invention to provide a method and an apparatus for heat-treating an SOI substrate adapted to suppressing with ease the etching and always uniformly smoothing the surfaces of a plurality of substrates, as well as a method of preparing an SOI substrate using such a method and such an apparatus.

Another object of the present invention is to provide a method and an apparatus for heat-treating an SOI substrate adapted to efficiently reduce impurities such as boron contained in the film, while maintaining the uniformity of film thickness, as well as a method of preparing an SOI substrate using such a method and such an apparatus.

Still another object of the present invention is to provide a method and an apparatus for heat-treating an SOI substrate adapted to reduce the variations in performance among the devices produced by using the SOI substrate, as well as to a method of preparing an SOI substrate using such a method and such an apparatus.

A further object of the present invention is to provide a method and an apparatus for heat-treating an SOI substrate at low cost adapted to obtain a desired film thickness and a surface condition substantially free from surface defects, as well as to a method of preparing an SOI substrate using such a method and such an apparatus.

According to an aspect of the present invention, there is provided a method for heat-treating an SOI substrate having a silicon surface comprising a step of:

heat-treating the SOI substrate in a hydrogen-containing reducing atmosphere, with keeping the SOI substrate in a state disposed opposite to a planar surface comprising a material comprised of a non-oxidized silicon as a main component with a predetermined distance separating them.

According to another aspect of the present invention, there is provided an etching apparatus for carrying out the heat treatment method.

According to still another aspect of the present invention, there is provided an apparatus which comprises a reaction furnace having an inner surface comprising non-oxidized silicon and adapted to contain an SOI substrate and reduce the internal pressure.

According to a further aspect of the present invention, there is provided a method of preparing an SOI substrate which comprises a step of:

smoothing a surface of the SOI substrate by the heat treatment method above.

According to a further aspect of the present invention, there is provided a method of preparing an SOI substrate having a silicon film which comprises the steps of:

bonding a second article and a first article containing a separation layer for defining a separating position;

transferring the silicon film onto the second article by separating the bonded first and second articles at the layer defining the separating position;

arranging a planar surface of non-silicon oxide opposite to the silicon film transferred onto the second article; and ¶ heat-treating the silicon film in a hydrogen-containing reducing atmosphere.

According to a further aspect of the present invention, there is provided a method of preparing an SOI substrate having a silicon film which comprises the steps of:

bonding a first article and a second article;

removing a part of the first article from the bonded first and second articles so as to leave a silicon film on the second article; ¶ arranging a planar non-oxidized silicon surface opposite to an unpolished surface of the silicon film; and ¶ heat-treating the silicon film in a hydrogen-containing reducing atmosphere.

BRIEF DESCRIPTION OF THE DRAWINGS

FIGS. 13A, 13B, 13C and 13D are schematic illustrations of a method of preparing a semiconductor article by using a heat treatment method according to the invention and a cleave process by ion implantation.

FIGS. 15A and 15B are schematic illustrations of a heat treatment method according to the invention, showing its smoothing effect.

FIGS. 16A, 16B, 16C, 16D and 16E are schematic illustrations showing how articles are arranged for a heat treatment operation for the purpose of the invention.

DESCRIPTION OF THE PREFERRED EMBODIMENTS

Figure 1:
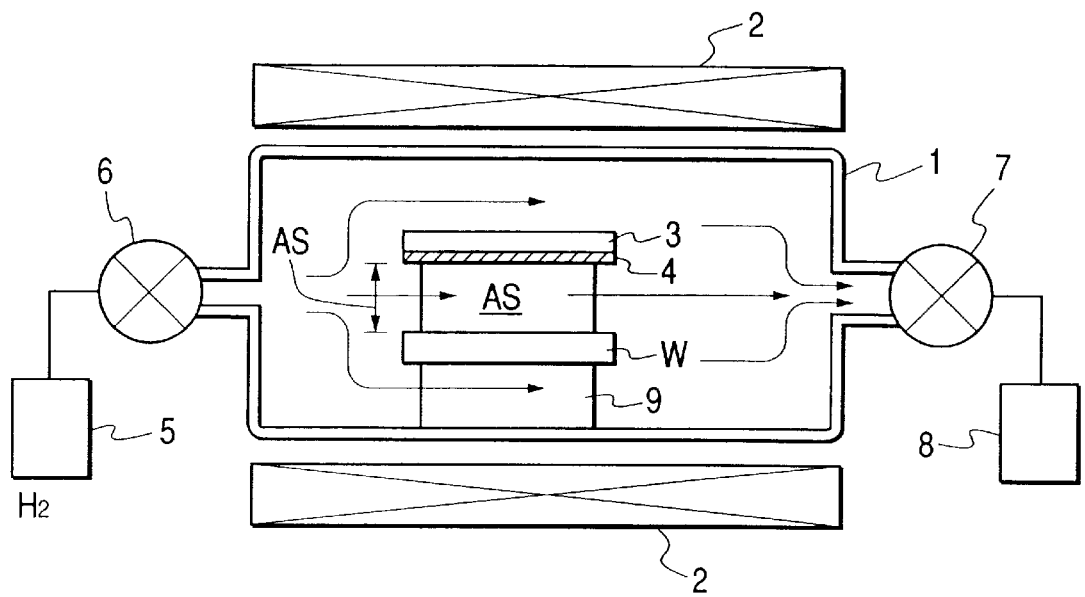
FIG. 1 is a schematic cross-sectional view of an embodiment of a heat treatment apparatus according to the invention.

FIG. 1 is a schematic cross-sectional view of an embodiment of a heat treatment apparatus according to the invention.

This heat treatment apparatus comprises a reaction furnace 1 operating as heat treatment chamber and adapted to contain a semiconductor article (SOI substrate) W and be evacuated and a heater 2 for heating the article W and the gas contained in the furnace 1. It is connected to a hydrogen gas source 5 by way of at least a valve 6 and also to an exhaust pump 8 by way of at least a valve 7.

A counter-surface constituting member 3 that has a planar surface of a material containing non-oxidized silicon 4 a principal ingredient is arranged at the side of the surface of the article W to be treated with a predetermined gap AS interposed therebetween. In FIG. 1, numeral 9 denotes a support member for supporting both the article W and the counter-surface constituting member 3.

The heat treatment operation using this embodiment proceeds in a manner as described below.

First, an article W and a counter-surface constituting member 3 are placed in the reaction furnace 1 with a predetermined gap AS interposed therebetween, and the inside of the furnace is evacuated by the exhaust pump 8 to reduce the internal pressure. Then, they are heated by the heater 2.

Thereafter, hydrogen gas is introduced into the furnace from the gas source 5. The inside of the furnace and the article W are held to a predetermined temperature by controlling the heat generation of the heater 2.

Then, as a result, silicon is annealed from the surface (to be treated) of the article W.

The article (SOI substrate) W to be heat-treated by a method according to the invention may be an SOI wafer of any of the above-described types prepared using a bulk Si wafer prepared by means of a CZ process, an epitaxial Si wafer having an epitaxially grown layer or an Si wafer obtained by treating a bulk Si wafer by using of a hydrogen annealing process or a vitreous silica substrate having a silicon film. In particular, it is preferably an SOI wafer that has been subjected to a surface treatment process after polishing and which has undulations on its surface, an SOI wafer having an unpolished surface or an SOI wafer being prepared using a bonding process or a SIMOX process.

Since an article W is heat-treated in a hydrogen-containing atmosphere according to the invention, the source gas to be fed into the furnace refers to 100% hydrogen gas or inert gas such as inert gas containing hydrogen by 1 to 99%. Preferably, relatively highly pure hydrogen gas that is sufficiently free from moisture is fed into the furnace by way of a hydrogen refining system (hydrogen purifier) so that the reducing atmosphere may show a dew point not higher than −92° C.

The oxygen and moisture content of the atmosphere should be held to a minimal level because any oxygen and moisture remaining in the atmosphere can oxidize silicon on the surface of the article W to produce a film coat as the temperature is increased and the produced film coat in turn obstructs the process of smoothing the surface and also because the residual oxygen and moisture can give rise to an unexpected reduction in the silicon film thickness as a side effect of oxidation and etching. This is why it is desirable to control the atmosphere so as to make it show a dew point not higher than −92° C.

While the hydrogen-containing atmosphere may show a pressure level higher than, equal to or lower than atmospheric pressure, its pressure is preferably equal to or lower than atmospheric pressure, although a lower pressure level may be advantageous to improve the surface smoothing effect and the effect of externally diffusing the impurities. When an etching furnace is made from fused quartz, the lower limit of the pressure of the atmosphere in the furnace is preferably set to $3.9 \times 10^4$ Pa, more preferably to $6.6 \times 10^4$ Pa in order to prevent the furnace from being deformed.

In view of the above considerations, it is reasonable to select a pressure level between atmospheric pressure and 1.3 Pa for the pressure of the atmosphere in the furnace, taking the operation environment into consideration.

Although there is no limit for the flow rate of hydrogen-containing gas to be used for the purpose of the invention, the flow rate as discussed below is preferably used.

The flow rate as used herein refers to the flow rate of gas passing through an area obtained by subtracting the cross-sectional area of the semiconductor article from the cross-sectional area of the furnace tube. If the gas flow rate is too high, the rate of removing the reaction product from the surface of the article is raised to reduce the etching suppressing effect.

If, on the other hand, the gas flow rate is too low, the rate of removing the reaction product from the surface of the articles is remarkably reduced, thereby to reducing the effect of removing the impurities such as boron by externally diffusing them from the semiconductor single crystal layer.

For the purpose of the invention, the gas flow rate is preferably 10 to 300 cc/min·cm$^2$, more preferably 30 to 150 cc/min·cm$^2$. The gas flow rate is a parameter for controlling the rate of diffusing and removing the reaction product from the surface to the lateral sides of the article.

The surface of the article is satisfactorily etched and smoothed in a hydrogen-containing atmosphere at temperature below 1,200° C., at which the surface may not be smoothed in a nitrogen atmosphere or an inert gas atmosphere. For the purpose of the invention, the temperature to be used for the etching process that has a smoothing effect depends on the composition and the pressure of gas. More specifically, the temperature is found within a range whose lower limit is preferably not lower than 300° C., more preferably not lower than 500° C., further preferably not lower than 800° C. On the other hand, the upper limit of the temperature range is preferably not higher than the melting point of silicon, more preferably not higher than 1,200° C. If the smoothing process proceeds too slowly, a smoothed surface can be obtained by using a longer period of time for the heat treatment.

For the purpose of the invention, while the counter-surface constituting member 3 may be made of any material so long as the counter-surface carries a material containing non-oxidized silicon as a principal ingredient, it is preferably a Si wafer from which any natural oxide film is removed, a Si wafer having a film of non-oxidized silicon such as silicon nitride or silicon carbide on the surface or vitreous quartz wafer having a surface on which a film of non-oxidized silicon such as Si, SiN or SiC is formed. A wafer having the same structure same as the article to be heat-treated may preferably be used for the counter-surface constituting member 3 if the counter-surface carries a silicon oxide film thereon.

The counter-surface should be planar and held in parallel with the surface to be treated. As for size and shape, the counter-surface preferably has a size equal to or greater than that of the surface to be treated of the article W and a profile similar to that of the article W.

The counter-surface constituting member 3 may preferably be part of the support member 9, which may typically be a tray. While the distance, or the gap AS, separating the counter-surface and the article may vary as a function of the silicon surface area (to be annealed) of the semiconductor article, it is preferably not greater than 20 mm, more preferably not greater than 10 mm, to achieve an effect of suppressing the etching due to the interaction of the oppositely disposed surfaces, when the semiconductor article has a diameter greater than 100 mm. Although the distance between the oppositely disposed surfaces has no lower limit, it is preferably not smaller than 1 mm, more preferably not smaller than 3 mm.

A surface smoothing process starts when the cleansed surface of the semiconductor article W is heat-treated. Therefore, if the surface of the article is coated with a thick natural oxide film, it is preferably removed by etching, using dilute hydrofluoric acid in order to make the surface smoothing process start early.

The silicon surface smoothed in this way is highly suited for preparing semiconductor devices.

Thus, according to the invention, a thin SOI layer having a thickness less than 450 nm or a particularly thin and uniform SOI layer having a thickness between 20 nm and 250 nm can be produced without difficulty.

Then, the obtained surface is smoothed and will show, for example, an Rrms value of at least not greater than 0.4 nm, preferably not greater than 0.2 nm, more preferably not greater than 0.15 nm, in a 1 μm square area.

Hydrogen containing gas may be introduced into the furnace in any appropriate manner as will be described hereinafter, and the present invention is not limited to the arrangement of FIG. 1 in terms of the way of introducing gas into the furnace.

As for the material of the reaction furnace 1, the reaction furnace is preferably made of a material consisting of non-oxidized silicon particularly for the inner surface of an area located close to the article W. For example, the use of a SiC reaction tube is preferable.

For the purpose of the invention, the heater 2 may be a resistance heater, a high frequency heater or a lamp.

Now, some of the findings that have led to the present invention will be described below.

Figure 2:
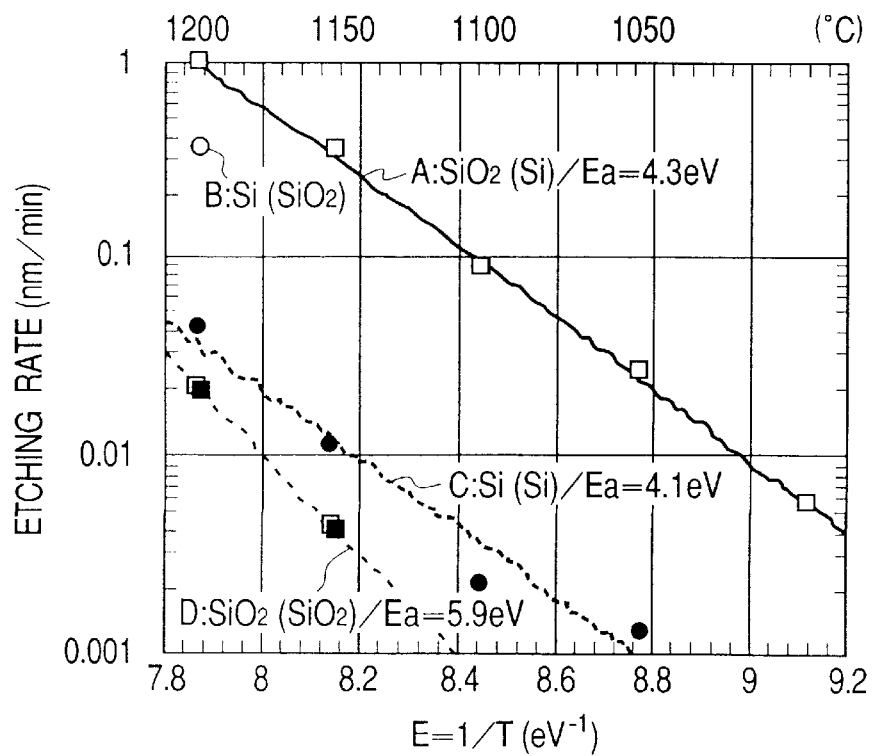
FIG. 2 is a graph showing the dependency of the etching rate on the material of the counter-surface.

Findings on the Dependency of the Etching Rate on the Material of the Counter-Surface The inventors of the present invention looked into the conditions for the heat treatment to be conducted in a hydrogen-containing atmosphere in order to remove fine undulations on a silicon single crystal silicon surface and found that the rate of etching single crystal silicon varies remarkably depending on the material of the surface opposing the single crystal silicon surface (counter-surface). FIG. 2 is a graph showing the dependency of the etching rate on the material of the counter-surface and the heat treatment temperature. In the graph of FIG. 2, the lower horizontal axis represents the reciprocal number of temperature (T) and the upper horizontal axis represents the temperature corresponding to 1/T, whereas the vertical axis represents the logarithmically expressed etching rate (nm/min.). The film thickness of the SOI layer or the single crystal silicon layer on a buried insulator can be observed without difficulty by means of a commercially available light-reflection type film thickness gauge. Then, the etching rate can be determined by observing the film thickness before and after the heat treatment with varied durations and calculating the change with time of the film thickness.

In FIG. 2, data set A represents the etching rate that varies as a function of temperature when a counter-surface of Si is arranged opposite to an article of $SiO_2$ that is etched. The activation energy Ea as obtained from the inclination of the approximate line produced by using the method of least squares of the observed values on the plot was about 4.3 eV.

Data set B in FIG. 2 represents the etching rate in a heat treatment process when a counter-surface of $SiO_2$ is arranged opposite to an article of Si that is etched. Data set C in FIG. 2 represents the etching rate in another heat treatment process when a counter-surface of Si is arranged opposite to an article of Si that is etched. The activation energy Ea of this heat treatment was about 4.1 eV.

Finally, data set D in FIG. 2 represents the etching rate in another heat treatment process when a counter-surface of $SiO_2$ is arranged opposite to an article of $SiO_2$ that is etched. The activation energy Ea of this heat treatment was about 5.9 eV.

As seen from data sets B and C in FIG. 2, with a heat treatment conducted in a hydrogen-containing atmosphere, the silicon etching rate is increased by 9 times without changing the temperature when the counter-surface of silicon is replaced by a counter-surface of silicon oxide.

More specifically, the etching rate is as low as about 0.045 nm/min. at 1,200° C. when two single crystal silicon surfaces are arranged vis-a-vis, or a silicon counter-surface is arranged opposite to a silicon surface to be etched (C in FIG. 2). Only less than 3 nm of the film is etched out after 60 minutes in the heat treatment. To the contrary, the etching rate is raised to about 0.36 nm/min. at 1,200° C. so that as much as 21.6 nm of the film is etched out after an hour when a silicon oxide counter-surface is arranged opposite to a silicon surface to be etched (D in FIG. 2). This etching thickness is comparable with that of a touch polish process.

Figure 3:
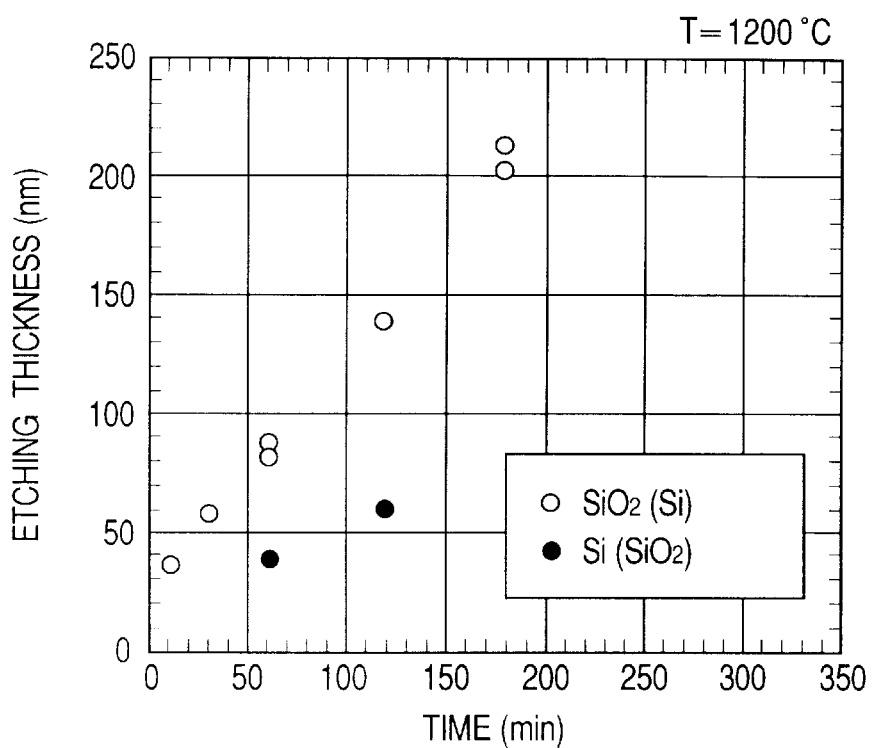
FIG. 3 is a graph showing the etching rate when the materials of the oppositely disposed surfaces are Si and $SiO_2$.

FIG. 3 is a graph showing the etching rate when the materials of the oppositely disposed surfaces are Si and $SiO_2$. In FIG. 3, the horizontal axis represents the etching time (min.) whereas the vertical axis represents the etching thickness (nm) when the heat treatment is conducted at temperature T of 1,200° C. In FIG. 3, the white circles show the values obtained when the article has a $SiO_2$ surface and the counter-surface is made of Si, whereas the black circles show the values observed when the article has a Si surface and the counter-surface is made of $SiO_2$.

As seen from FIG. 3, with a same duration of heat treatment, film is etched to a greater extent when the article has a $SiO_2$ surface and the counter-surface is made of Si as indicated by white circles than when the article has a Si surface and the counter-surface is made of $SiO_2$ as indicated by black circles. In short, when a $SiO_2$ surface and an Si surface are oppositely arranged for heat treatment, the $SiO_2$ surface is etched to a greater extent than the Si surface.

Figure 4:
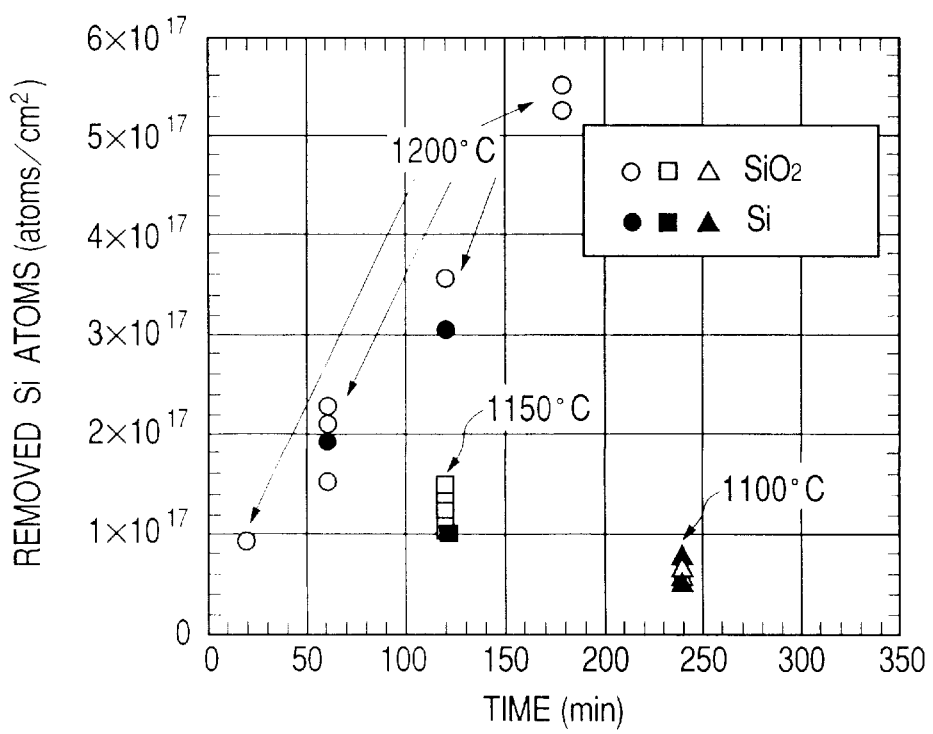
FIG. 4 is a graph showing the rate of removing Si atoms when the materials of the oppositely disposed surfaces are Si and $SiO_2$.

FIG. 4 is a graph showing the rate of removing Si atoms when a $SiO_2$ surface is etched, using an Si counter-surface, and that of removing Si atoms when a Si surface is etched, using a $SiO_2$ counter-surface is used, as obtained by calculation on the basis of FIG. 3. In FIG. 4, the horizontal axis represents the etching time and the vertical axis represents the number of removed Si atoms (atmos/cm$^2$), the observed $SiO_2$ surfaces being indicated by white circles, triangles and squares, the observed Si surfaces being indicated by black circles, triangles and squares.

It will be appreciated from FIG. 4, which shows the number of removed silicon atoms calculated from the etched volume of a silicon oxide surface and also the number of silicon atoms calculated from the etched volume of a single crystal silicon surface as illustrated in FIG. 3, that the number of removed silicon atoms is substantially the same for the two surfaces. In other words, when a Si surface and a $SiO_2$ surface are arranged oppositely relative to each other for heat treatment, Si atoms will be lost substantially at a same rate from the two surfaces.

Thus, the rate of etching a silicon surface is accelerated by the interaction with a silicon oxide surface arranged opposite to it. This interaction will generally be expressed by the reaction formula shown below, where silicon and silicon oxide react in a ratio of 1:1.

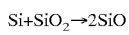

The Si etching rate is affected by the distance between the Si surface and the counter-surface. It has been found that, when a silicon counter-surface is used, the etching rate is reduced as the distance separating the two surfaces is reduced. When, on the other hand, a silicon oxide counter-surface is used, the etching rate increased as the distance between the two surfaces is reduced.

Additionally, the etching rate is remarkably low when the etching process is conducted in an atmosphere containing no reducing gas, which is typically hydrogen gas, as compared to the etching rate observed when the atmosphere contains reducing gas. In short, the presence of reducing gas, which is typically hydrogen gas, can significantly accelerate the etching rate. When a silicon surface and a silicon oxide surface are arranged opposite to each other in the etching system, the two surfaces are etched as the material of either one of the surfaces gets to the other one by way of the reaction with the reducing gas, which is typically hydrogen gas. For instance, there may be reactions expressed by $Si+H_2 \rightarrow SiH_2+SiO_2 \rightarrow 2SiO+H_2$. The Si atoms that have left the Si surface are, at least partly, transported through the gas phase to the silicon oxide surface, where they react with $SiO_2$ to produce SiO, which shows high saturated vapor pressure. Since $SiH_2$ is consumed as it is needed, the etching process on the Si surface will be promoted. When, on the other hand, two Si surfaces are arranged opposite to each other, the rate of chemical reaction of the Si atoms that have left the Si surfaces proceeds only as a function of the diffusion in the vapor phase once they get to a saturated concentration level, which is hardly becomes high, so that the etching rate will not become very high.

To the contrary, when a Si surface and a $SiO_2$ surface are opposed, the Si atoms that have left the Si surface are, at least partly, consumed on the surface of the oxide film so that the chemical reaction can proceed without any restrictions. Since SiO that can be produced on the $SiO_2$ surface shows a high vapor pressure, the reaction can proceed without restrictions.

When a silicon carbide surface is arranged opposite to a single crystal silicon film, the rate of etching the single crystal silicon film is substantially the same as the limited etching rate that is observed when silicon is used for the counter-surface. Likewise, when a silicon nitride surface is arranged opposite to a single crystal silicon film, the rate of etching the single crystal silicon film is also low and substantially the same as the limited etching rate observed when silicon is used for the counter-surface.

In short, in a process of heat-treating Si in a hydrogen-containing reducing atmosphere, a material containing silicon and either carbon or nitrogen as principal ingredients or, in other words, a material not containing oxygen as the principal ingredient is used for the opposite surface. That is, by using for the counter-surface a material constituted of silicon and a substance that does not react in the above-described atmosphere, the etching rate can be reduced to at least less than $\frac{1}{10}$, practically equal to 0, as compared to a case where silicon oxide is used for the counter-surface.

Heat Treatment Apparatus

While FIG. 1 shows a typical heat treatment apparatus according to the invention, it may be modified in various different ways as will be described hereinafter.

Figure 5:
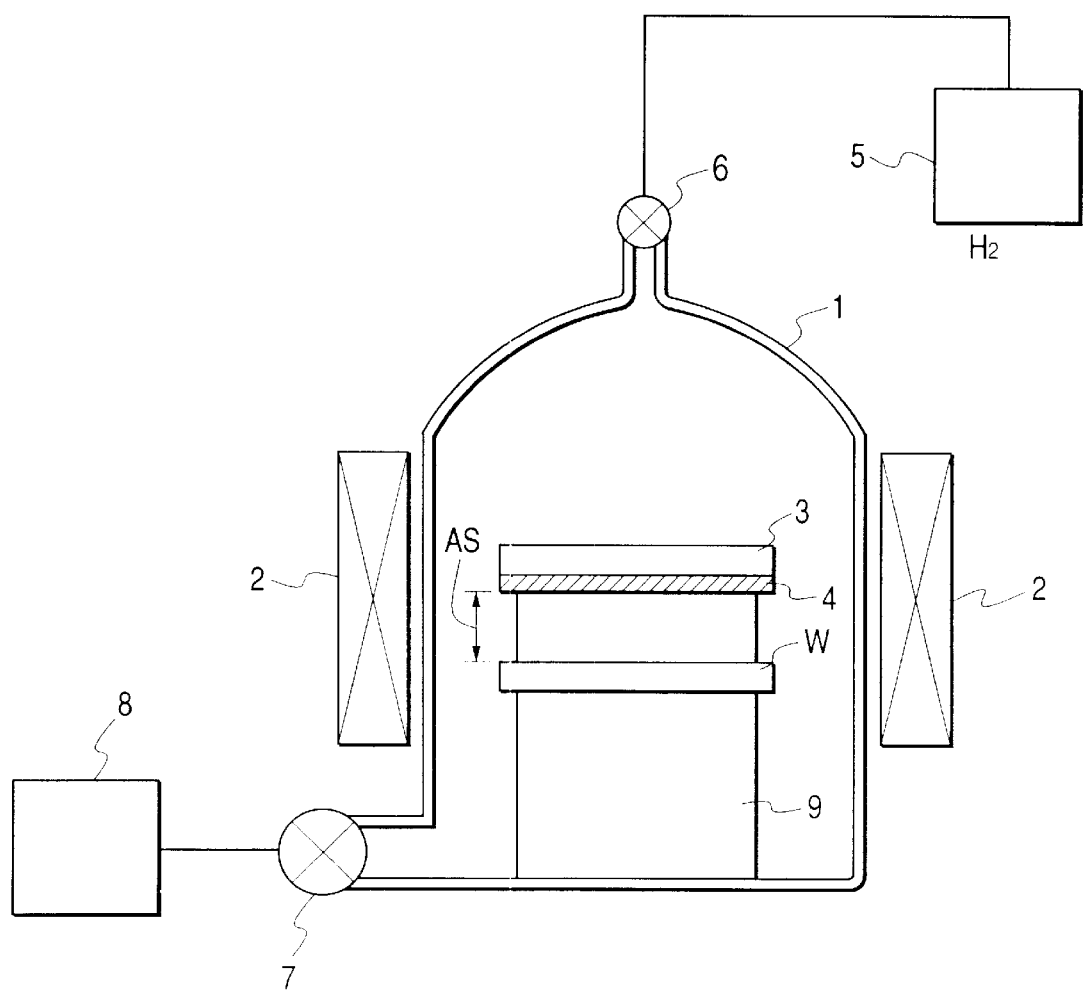
FIG. 5 is a schematic cross-sectional view of another embodiment of a heat treatment apparatus according to the invention.

FIG. 5 is a schematic cross-sectional view of another embodiment of a heat treatment apparatus according to the invention.

The embodiment of FIG. 5 is so configured that part of hydrogen-containing gas from the gas source 5 is made to pass the gap, or the acting space AS, between the article W and the counter-surface constituting member 3 before it flows into the exhaust pump 8. The exhaust pump 8 is not required in the case of treatment under high pressure or atmospheric pressure.

The mode of arrangement of the article W and the counter-surface constituting member 3 is not limited to the one shown in FIG. 1, they are arranged longitudinally (transversally in the drawing) in parallel with the furnace tube of the furnace 1. They may alternatively be arranged as shown in FIG. 5 or still alternatively be arranged in an inclined fashion or vertically in a horizontal furnace.

Still alternatively, a plurality of articles W may be arranged at intervals and in parallel with each other in a single furnace.

Figure 6:
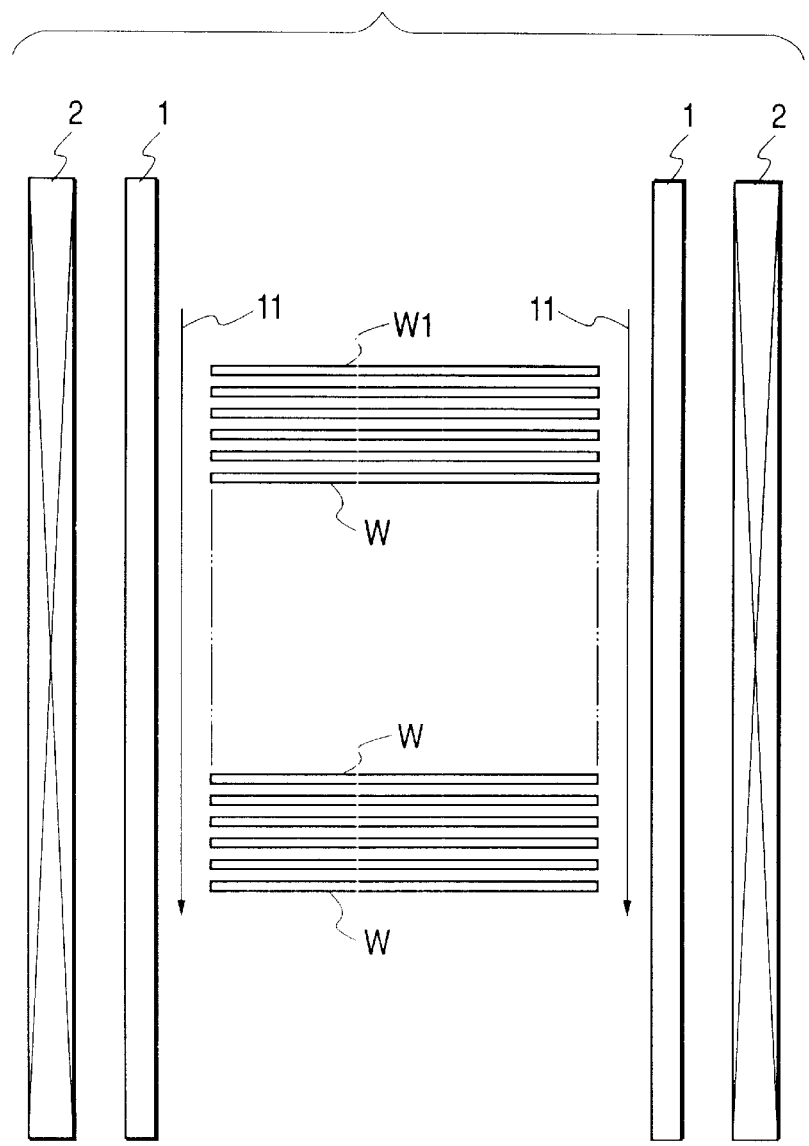
FIG. 6 is a schematic cross-sectional view of a still another embodiment of a heat treatment apparatus according to the invention, showing a principal area thereof.

FIG. 6 is a schematic cross sectional view of an embodiment of a heat treatment apparatus according to the invention and adapted to collectively heat-treat a plurality of articles.

With the embodiment of etching apparatus of FIG. 6, a plurality of articles, W1, W consisting of a non-oxidized silicon film on the rear surface are arranged in the furnace in such a way that all the front surfaces of the articles are directed upward. Then, since no counter-surface is found for the top article W1, the silicon surface of the article W1 will not be heat-treated in an intended manner. Differently stated, the top article W1 operates as a dummy article. All the articles W except the top article W1 have a counter-surface located vis-a-vis, which is the non-oxidized silicon rear surface of the directly upper articles W, so that all the silicon surfaces of the articles W will practically not be etched and simply annealed.

When all the articles W1, W are arranged with the silicon front surfaces directed downward, the bottom article operates as a dummy article.

FIG. 6 shows only a principal area of a vertical furnace. When a horizontal furnace having a configuration that can be realized by substantially turning the furnace of FIG. 6 to a lateral side is used, a plurality of articles will be arranged side by side and collectively annealed in a similar fashion.

Note, however, that the furnace of FIG. 6 is adapted only to collectively anneal articles having a non-oxidized silicon rear surface.

Figure 7:
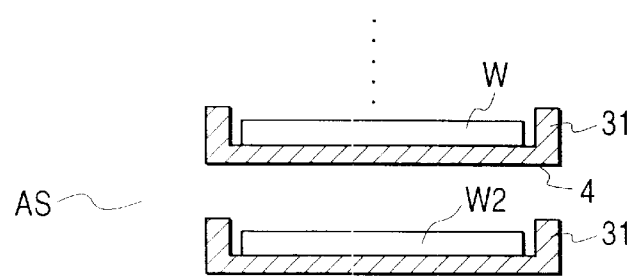
FIG. 7 is a schematic cross-sectional view of a pair of counter-surface constituting members, showing a mode of arrangement that can be used for the purpose of the invention.

FIG. 7 shows an arrangement adapted to heat-treating articles having an oxidized silicon rear surface such as SOI wafers or vitreous silica substrates whose rear surface is covered by oxidized silicon.

With this arrangement, a counter-surface constituting member 31 having at least a non-oxidized silicon rear surface is interposed between two adjacent articles so that the Si surface of the lower article W2 is located vis-a-vis the non-oxidized silicon rear surface (counter-surface 4) of the counter-surface constituting member 31. Thus, the Si surface of the article W2 will not be etched but annealed properly. While the counter-surface constituting members 31 of FIG. 7 have a tray-like profile, they are not limited to such a shape and may be replaced by plate-shaped members. Such a member can be prepared by using SiC or Si. Alternatively, it may be prepared by coating the surface of a vitreous silica base with Si, SiC or SiN.

In any case, the distance between the Si surface and the counter-surface is preferably not greater than 20 mm, more preferably not greater than 10 mm, to achieve an effect of suppressing the etching due to the interaction of the oppositely disposed surfaces, when the semiconductor article has a diameter greater than 100 mm.

The rate of etching the silicon on the principal surface (front surface) of the article during the heat treatment process conducted in a hydrogen-containing atmosphere is accelerated when one or more than one oxidizing impurity such as moisture and/or oxygen are contained in the atmosphere gas. The etching effect due to these gaseous impurities can be reduced by reducing the flow rate of atmosphere gas on and near the principal surface in order to reduce the rate of supply of the impurities such as moisture and/or oxygen. In this manner, the etching process involving the interaction of the silicon surface and the non-oxidized silicon counter-surface can be suppressed. Particularly, the flow rate 12 of atmosphere gas on the front surface of article W can be reduced practically to 0 and the etching potential of the non-oxidized silicon of the counter-surface can be maximally exploited when the article W is so arranged in the furnace tube 1 that the gas flows 11, 14 intersect the direction of the silicon surface of the article and the non-oxidized silicon counter-surface 4; the former is located vis-a-vis wafer 81 surface and separated from the latter by not greater than 20 mm as shown in FIG. 8.

Figure 8:
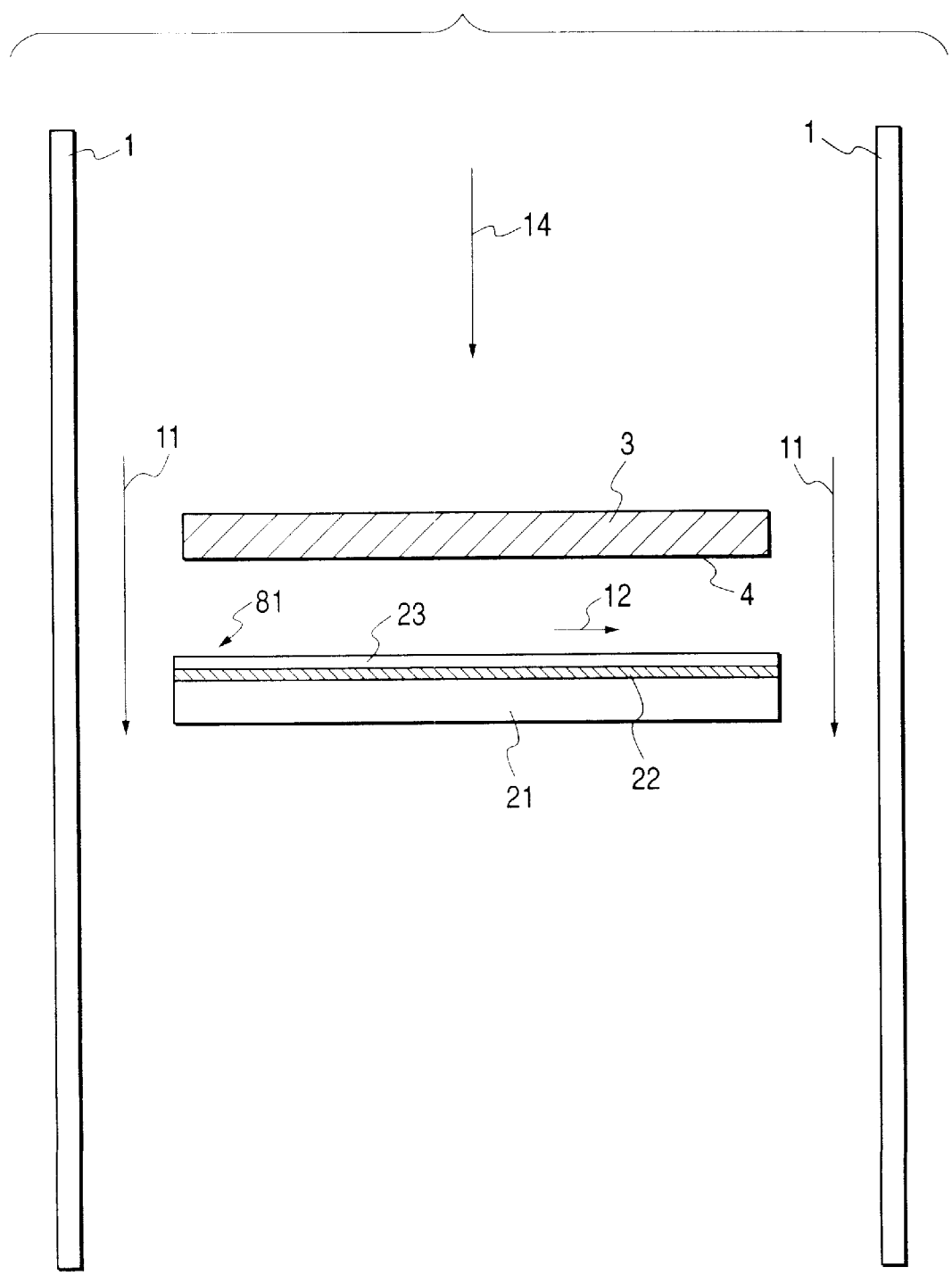
FIG. 8 is a schematic cross-sectional view of a semiconductor article and a counter-surface constituting member, showing another mode of arrangement that can be used for the purpose of the invention.

Note that, in FIG. 8, there are shown an SOI substrate comprising a buried insulation film 22 and an SOI layer 23 formed on a silicon substrate 21 and a counter-surface constituting member 3 comprising a silicon substrate from which the natural oxide film, if any, had been removed.

Figure 9:
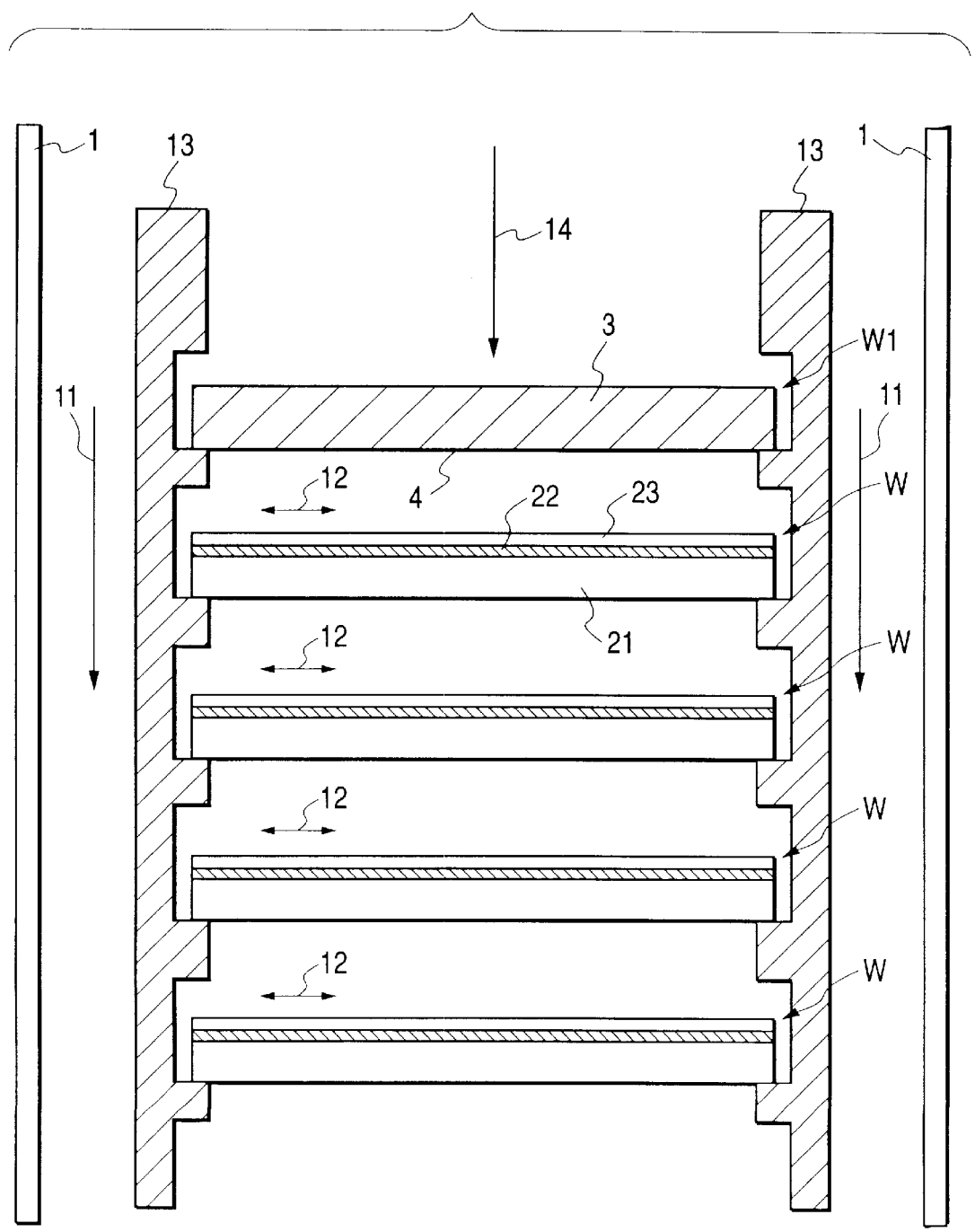
FIG. 9 is a schematic cross-sectional view of a still another embodiment of a heat treatment apparatus according to the invention, showing a principal area thereof.

FIG. 9 is a schematic cross-sectional view of a heat treatment apparatus prepared by modifying the vertical furnace shown in FIG. 5.

In FIG. 9, a total of four articles W and a dummy article W1 are arranged coaxially and held by respective projections of boat 13, which is the support member of the etching apparatus.

The dummy article W1 is a Si substrate carrying no silicon oxide film on both the front and rear surfaces, whereas the articles W are Si substrates carrying no silicon oxide film on the rear surface.

In this case again, the flow rate of the gas flow 11 passing through the area obtained by subtracting the cross-sectional area of the semiconductor articles from the cross-sectional area of the furnace tube (outer peripheral area of the furnace tube) is maintained at 10 cc/min·cm$^2$ to 300 cc/min·cm$^2$, and the flow rate of the gas flow 12 on and near the front surface of each article W that is running in parallel with the front surface is made lower than the flow rate of the gas flow 11 running perpendicularly to the front surface in the outer peripheral area of the article W.

Preferably, the flow rate of the gas flow 11 passing through the area obtained by subtracting the cross-sectional area of the semiconductor articles from the cross-sectional area of the furnace tube (outer peripheral area of the furnace tube) is maintained at 30 cc/min·cm$^2$ to 150 cc/min·cm$^2$, and the flow rate of the gas flow 12 on and near the front surface of each article W that is running in parallel with the front surface is practically equal to 0.

Figure 10:
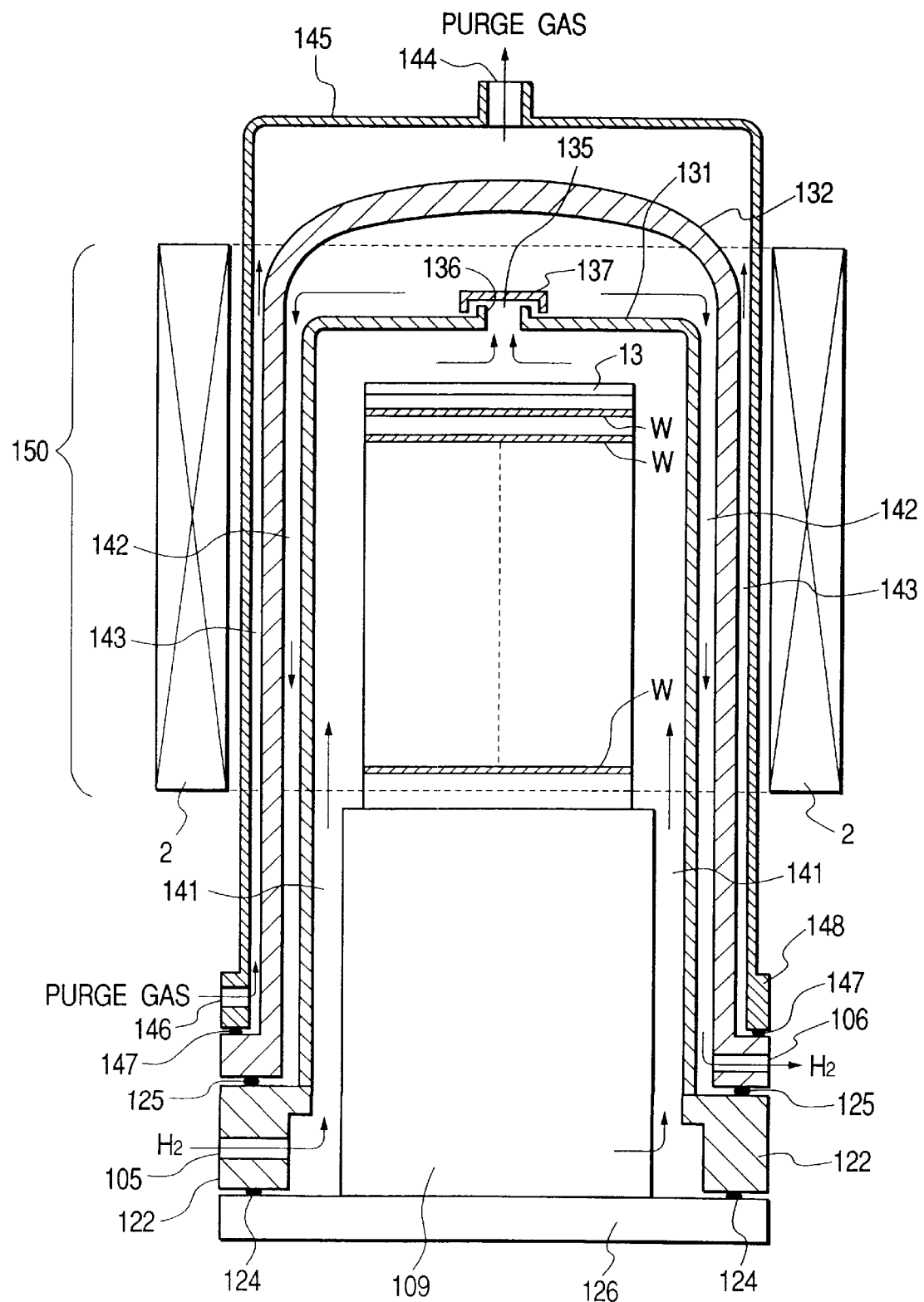
FIG. 10 is a schematic cross-sectional view of still another embodiment of a heat treatment apparatus according to the invention.

FIG. 10 is a schematic c cross sectional view of still another embodiment of heat treatment apparatus according to the invention.

This heat treatment apparatus comprises an inner tube 131 having an inner surface of non-oxidized silicon such as SiC, a furnace tube 132 made of fused quartz or vitreous silica and an outer tube 145 having a surface of non-oxidized silicon such as SiC. In FIG. 10, 124, 125 and 145 denote O-rings and 122 and 145 denote flanges, while 126 denotes a sealing closure.

Hydrogen-containing reducing gas is introduced from an inlet port 105 into the space where wafers W are arranged by way of a flow path 141. Then, gas flows further from the opening 135 to the flow path 142 between the furnace tube 132 and the inner tube 131 by way of return-checking means (136, 137) such as non-return valves. Then, gas in the flow path 142 is expelled from the exhaust port 106.

Inert gas such as He, Ar, Ne, N$_2$, Kr or Xe is introduced into the space 143 between the furnace tube 132 and the hermetically sealed outer tube 145 through a purge gas inlet port 145 located below and discharged through a purge gas exhaust port 144 located above.

Hydrogen gas would not be brought into contact with silicon oxide heated above 1,000° C. until the former is introduced into the space where wafers W are arranged and high temperature prevails. Heat barrier 109 made of foamed quartz, which is silicon oxide, is located outside the high temperature region 150 heated by a heater 2 and, therefore, practically no moisture is generated by hydrogen gas fed through the flow path 141. Therefore, moisture in the supplied hydrogen gas is negligible.

All the components of the apparatus located in the space of the heated high temperature region 150 inside the inner tube 131, where wafers W are arranged, are made of a non-oxidized silicon material such as SiC so that moisture generation is this space is also minimized.

Gas in the inner tube 131 is discharged through an opening 135 located at the center of the tube to produce a uniform gas flow. The furnace tube is a hermetically sealed tube made of silicon oxide such as fused quartz, and hence it shows an excellent thermal insulation effect and produces a uniform temperature distribution in the heated high temperature region 150. If hydrogen gas leaks out from the inner tube 131, it would not flow out of the furnace tube 132.

Additionally, the boat 13 for holding wafers W has a surface of non-oxidized silicon such as SiC, and hence it would not generate any moisture.

The hermetically sealed outer tube 145 and purge gas prevent metal impurities coming from the heater 2 from entering the inner tube.

The boat 13 has a plane of non-oxidized silicon such as SiC that faces the top wafer W to prevent the top wafer W from being etched.

The rear surface of the wafers W are of non-oxidized silicon as the oxide film, if any, is removed to expose silicon, or the rear surface is coated with a non-oxidized silicon film.

With any of the above-described embodiments of heat treatment apparatus, the furnace 131, the tray 31, the support members 9, 13 preferably are not made of vitreous silica but have a non-oxidized silicon surface typically of SiC, Si or SiN.

The heater 2 may be a resistance heater, a radio frequency heater or a lamp heater. It is preferable that a reaction furnace 1 is provided with a loading chamber having inert gas introducing means and wafers W are transferred from the loading chamber to the reaction furnace 1 while the inside of the furnace 1 is not exposed to gas containing oxygen.

Method of Preparing an SOI Substrate

Now, a method of preparing an SOI substrate, using a heat treatment method according to the invention, will be described.

Figure 11:
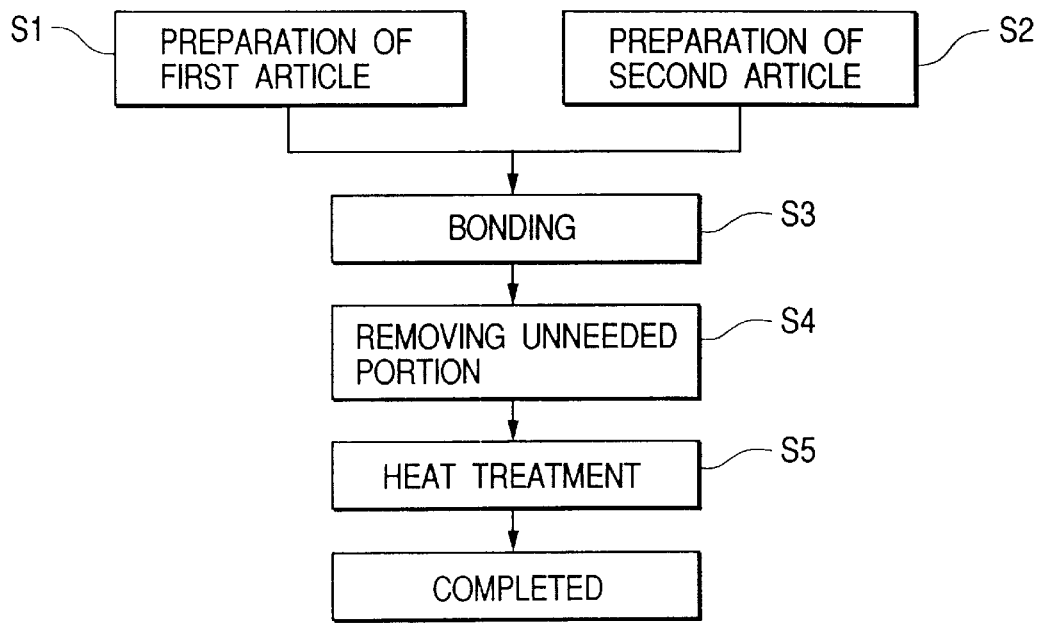
FIG. 11 is a flow chart for a mode of carrying out a method of preparing a semiconductor article by using a heat treatment method according to the invention.

FIG. 11 is a flow chart for preparing a bonded SOI substrate by the cleave process using hydrogen ion implantation or the epitaxial layer transfer process, which may typically be the PACE process.

First first article is prepared in Step S1. More specifically, hydrogen ions or inert gas ions are implanted into a Si wafer carrying an oxide insulation film formed on at least one of the surfaces to produce a (potential) separation layer at a predetermined depth. Alternatively, the surface of a Si wafer is made porous, and the non-porous Si layer is subjected to an epitaxial growth. When the PACE process is used, a Si wafer carrying no oxide film or an Si wafer having its surface oxidized will be prepared.

Meanwhile, a second article is prepared in Step S2. The second article may be a Si wafer obtained by oxidizing the surface of an ordinary Si wafer, a Si wafer having its natural oxide film removed, a vitreous silica wafer or a metal substrate.

Subsequently in Step S3, the first and second articles prepared in Steps S1 and S2 respectively are bonded together directly or indirectly with an adhesive layer interposed therebetween. It will be sufficient when either of the surfaces of the first and second articles to be bonded together carries an insulator unless an article having a structure other than the SOI structure is prepared.

Before the bonding, the surfaces to be bonded may be activated by irradiating them with ions of hydrogen, oxygen, nitrogen or inert gas.

Then, in Step S4, (unnecessary) part of the first article that has been bonded to the second article (to produce an assembly) is removed. Generally speaking, two different techniques are available for removing part of the first article. One is the technique of removing part of the first article by grinding or etching, and the other is the technique of separating the front side portion and the rear side portion of the first article along the separation layer formed in the first article. When the latter technique is used, the unnecessary part can be used as a first or second article once again because it maintains the profile of a wafer after removal. The unnecessary part can be removed by heat-treating the assembly, blowing fluid that may be liquid or gas to a lateral side of the assembly or mechanically peeling it off from the rest.

The surface of the silicon layer (SOI layer) of the assembly (SOI substrate) that is now free from the unnecessary part is rather rough, showing voids, pores of the porous layer and/or undulations caused by the grinding or etching operation. Therefore, in Step S5, an upper portion of the silicon layer showing a rough surface is smoothed by heat-treating (annealing by means of hydrogen) it. Then, the surface roughness of the etched silicon layer is smoothed to a level of surface roughness of less than 0.2 nm (in a 1 m square area) due to the smoothing effect of the etching operation. If the etching is conducted under optimized conditions, the surface roughness can be reduced to less than 0.15 nm, in some cases to less than 0.1 nm.

Figure 12:
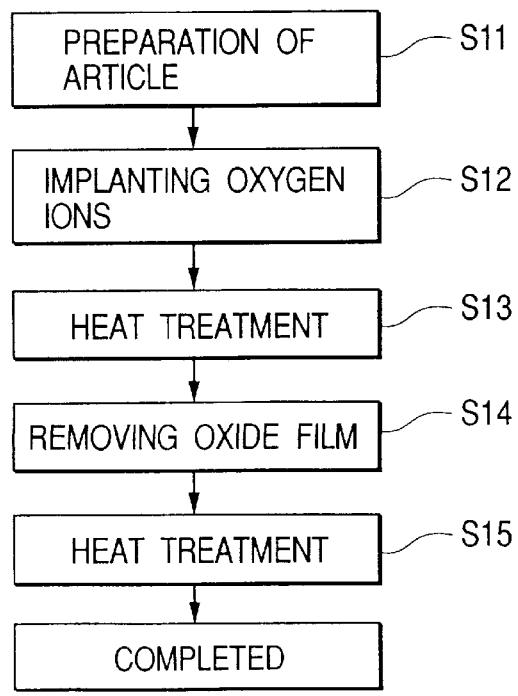
FIG. 12 is a flow chart for another mode of carrying out a method of preparing a semiconductor article by using an etching method according to the invention.

FIG. 12 is a flow chart for preparing an SOI substrate typically by means of a SIMOX process.

First in Step S11, a Si wafer is prepared as a starting material.

Then, in Step S12, oxygen ions are implanted typically with a dosing rate of about $2 \times 10^{17}$ cm$^{-2}$ to $4 \times 10^{18}$ cm$^{-2}$, using an acceleration voltage of between 100 eV and 300 eV.

Subsequently, in Step S13, the wafer implanted with oxygen ions is heat-treated at a temperature between 1,000° C. and 1,400° C. to produce a buried oxide film.

Then, in Step S14, the surface oxide film is removed from the surface of the SOI layer, if such an oxide film has been formed.

The surface of the SOI layer of the obtained SOI substrate shows undulations caused by the oxygen ion implantation (Step S12) and the formation of the buried oxide film (Step S13) if a polished wafer is used as the starting material. Thus, in Step S15, the wafer is subjected to a heat treatment operation (annealing operation using hydrogen) in a manner as described above to remove an upper portion of the SOI layer having undulations. After the etching, the surface of the SOI layer shows a surface roughness of less than 0.4 nm (Rrms) in a 1 $\mu$m square area and less than 1.5 nm (Rrms) in a 50 $\mu$m square area.

Of the above-described methods of preparing a semiconductor article according to the invention, preparing an SOI substrate by the cleave process using hydrogen ion implantation, will be discussed in greater detail by referring to FIGS. 13A through 13D.

In Step S21 shown in FIG. 13A, at least the surface of a Si wafer 31 that is the first article is thermally oxidized to produce a silicon oxide layer that becomes a buried insulation film 22, and then hydrogen or inert gas ions are implanted typically with a dosing rate of about $1 \times 10^{16}$ cm$^{-2}$ to $1 \times 10^{19}$ cm$^{-2}$, using an acceleration voltage of between 10 keV and 500 keV. Ions may be implanted by means of an ion implanter or, alternatively, from hydrogen or inert gas plasma, by utilizing the potential difference between the plasma and the wafer. As a result, a separation layer 32 is produced (FIG. 13A).

Then, in Step S22 shown in FIG. 13B, another Si wafer 21 that is a second article is prepared by removing the natural oxide film, if any, on the surface to be bonded thereof before the two Si wafers are bonded together with the Si surface held in contact with the surface of the insulation film 22 to produce an assembly.

Subsequently, in Step S23 shown in FIG. 13C, the assembly is heat-treated in an oxidizing atmosphere and separated into two parts along the separation layer 32. For separating the assembly into two parts, fluid (liquid or gas) may be applied to a lateral side of the assembly under high pressure until the separation layer that is a mechanically weak brittle layer is destroyed and the wafer 31 is peeled off (separated) from the assembly, leaving the silicon film 23 on the wafer 21. Alternatively, fine bubbles will be generated by hydrogen or inert gas ions to grow in the separation layer so that consequently the wafer 31 may be separated from the assembly, leaving the silicon film 23 on the wafer 21, if temperature higher than 500° C. is used for the heat treatment to be conducted in an oxidizing atmosphere simultaneously with or after the bonding step.

The wafer 31 separated from the assembly can be used as a first or second article once again because it maintains the profile of a wafer after removal, although its height is reduced by the thickness of the silicon film 23.

For reusing the separated wafer 31, the surface exposed as a result of the separation is polished, and a single crystal silicon film is made to grow thereon through epitaxial growth.

After the separation, the silicon film 25 shows a rough surface with undulations caused by fine bubbles (fine voids). Therefore, in Step S24 shown in FIG. 13D, it is arranged vis-a-vis a non-oxidized silicon plane and heated-treated in a hydrogen-containing reducing atmosphere to smooth an upper portion of the silicon film 23 including the rough surface by means of a method according to the invention in a manner as described above.

Since the wafer 21 carries a silicon oxide film 24 on the rear surface thereof as a result of the heat treatment conducted in an oxidizing atmosphere in the example of FIGS. 13A through 13D, the silicon oxide film may be left on the rear surface of the SOI substrate at the end of Step S23. Therefore, the silicon oxide film is removed by means of an etchant such as hydrofluoric acid, using the surface of the silicon film 25 as mask. Thereafter, a number of such SOI substrates can be simultaneously subjected to an etching process in an apparatus according to the invention as described above and illustrated in FIG. 6, 9 or 10.

Alternatively, the heat treatment for bonding the two substrates may be conducted in a non-oxidizing atmosphere so that an oxide film 24 may be formed on the rear surface during the bonding process. Then, a non-oxidized silicon rear surface can be obtained by removing the natural oxide film, if any, before the annealing operation using hydrogen.

Now, a method of preparing a semiconductor article by means of an epitaxial layer transfer process will be discussed in detail by referring to FIGS. 14A through 14F.

Figure 14A:
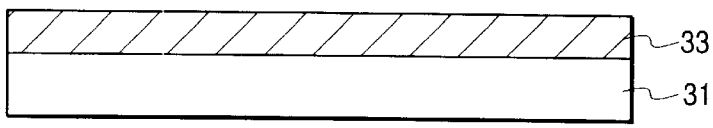
FIGS. 14A, 14B, 14C, 14D, 14E and 14F are schematic illustrations of a method of preparing a semiconductor article by using a heat treatment method according to the invention and an epitaxial layer transfer process.

First, in Step S31 shown in FIG. 14A, a Si single crystal substrate 31 is prepared as a first article, and a layer having a porous structure 33 is formed at least on the principal front surface thereof. Porous Si can be produced by anodizing the Si substrate in a HF solution. Such a porous layer shows a sponge-like structure, where pores with a diameter of about $10^{-1}$ nm to 10 nm are arranged with intervals of about $10^{-1}$ to 10 nm. While the density of single crystal Si is 2.33 g/cm$^3$, that of porous Si is variable and can be made to fall within a range between 2.1 and 0.6 g/cm$^3$ by regulating the concentration of the HF solution within a range between 50 and 20% and also regulating the current density and the rate at which alcohol is added to the reaction system. The porosity of the porous layer can be controlled by modulating the specific resistance and the conductivity type of the portion of the substrate to be made porous. A Si substrate having p-type conductivity will show a higher porosity when it is a non-degenerate substrate (P⁻) than when it is a degenerate substrate (P⁺) under the same anodizing conditions, because the former shows a pore density higher than the latter by a digit, although it may show a small pore diameter. In short, the porosity of the Si substrate can be controlled by regulating these conditions and using an appropriate method selected out of a number of feasible methods. The porous layer 33 may be a single layer or a multilayer structure comprising a number of layers with different porosities. When ions are implanted in such a way that their projection range is confined within the porous layer that is produced by anodization, bubbles will be formed in the pore walls located near the projection range and consequently the porosity of the layer can be raised. The ion implantation process may be conducted before or after the step of forming the porous layer by anodization or even after the step of forming a single crystal semiconductor layer on the porous layer 33.

Figure 14B:
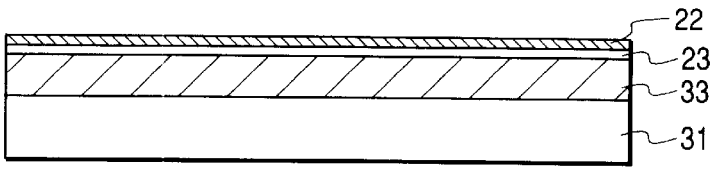
Figure 14C:
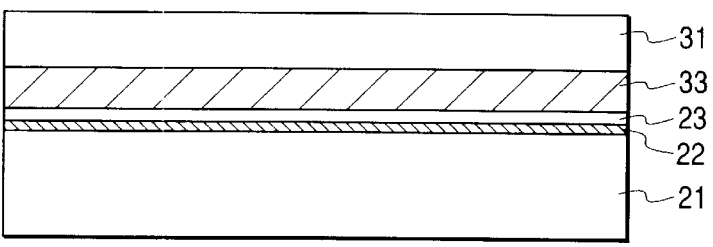

Then, in Step S32 shown in FIG. 14B, at least a non-porous single crystal semiconductor layer 23 is formed on the porous layer. Such a non-porous single crystal semiconductor layer 23 may be a single crystal Si layer formed by epitaxial growth, a layer formed by transforming a surface layer of the porous layer 33 into a non-porous layer or some other appropriate layer. If a silicon oxide layer 22 is formed on the single crystal Si layer 23 by thermal oxidation, the interface of the single crystal silicon layer and the buried oxide film will be a suitable interface formed by thermal oxidation with a low boundary energy level. In Step S33 shown in FIG. 14C, the principal surface (bonding surface) of the semiconductor substrate where said non-porous single crystal Si layer 23 has been formed is held in close contact with the front surface (bonding surface) of a second substrate 21. It is desirable to cleanse the surfaces in order to remove any adherent foreign objects from them before they are brought into close contact with each other. The second substrate may be a Si substrate, a substrate obtained by forming a silicon oxide film on a Si substrate, a light transmitting substrate typically made of quartz or a sapphire substrate, although it is not limited thereto so long as the surface to be bonded is sufficiently flat and smooth. While the second substrate is bonded to the first substrate with an insulation layer 22 interposed therebetween according to the illustration, the insulation layer 22 may not necessarily be used.

For bonding the two substrates, an insulator thin plate may be sandwiched between the first and second substrates to produce a three-layered structure.

Subsequently, the unnecessary portion on the rear surface of the first substrate 31 and the porous layer 33 are removed to expose the non-porous single crystal Si layer 23. Either of the above-described two techniques is used for this step of exposing the non-porous single crystal Si layer 23, although some other technique may alternatively be used.

Figure 14D:
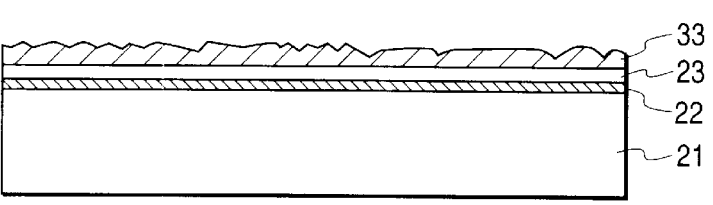

With the first technique, the first substrate 21 is removed from the rear side to expose the non-porous layer 33 (Step S34 shown in FIG. 14D).

Figure 14E:
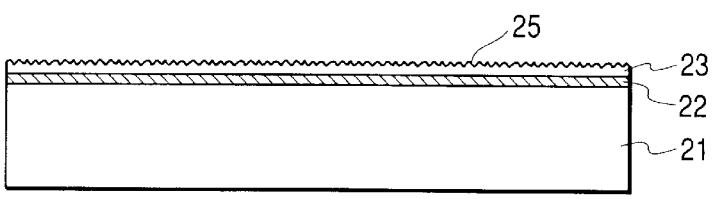

Thereafter, the porous layer 33 is removed to exposed the non-porous single crystal silicon layer 23 (Step S35 shown in FIG. 14E).

It is preferable to remove the porous layer by selective etching. Porous silicon can be selectively etched at a rate $10^5$ times greater than the rate of etching non-porous single crystal silicon when a mixture solution containing at least hydrofluoric acid and hydrogen peroxide is used. A surface active agent may be added to the etching solution in order to prevent bubbles from adhering to the surface. Alcohol such as ethyl alcohol may preferably be used as surfactant. The selective etching process may be omitted when the porous layer is very thin.

With the second technique, the substrates are separated along the porous layer 33 that operates as separation layer to produce a profile as shown in FIG. 14D for Step S34. The separation may be realized by the use of external force. Methods that can be used for the separation include, among others, application of external force such as pressure, tensile force or shearing force or the use of a wedge, application of ultrasonic waves, the use of heat, the use of a technique of producing internal pressure in the porous Si by oxidizing it and expanding it from the periphery, the use of pulsating heat for producing thermal stress in or softening the porous Si and ejection of a fluid jet stream such as a water jet or a gas jet.

Preferably, the separation layer comprises at least two layers having different porosities.

Subsequently, in Step S35, the residual porous layer 33 left on the front surface of the second substrate 21 is removed by etching. The technique used above for exposing the porous layer 33 by etching can also be used for etching out the residual porous layer 33. If the residual porous silicon layer 33 left on the second substrate 21 is very thin and uniform, this wet etching process using hydrofluoric acid and hydrogen peroxide may be omitted.

Figure 14F:
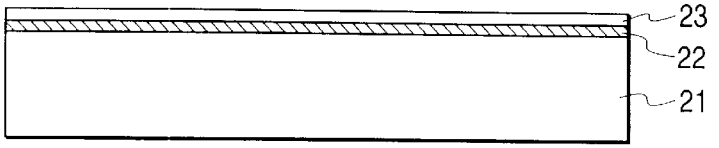

Then, in Step S36 shown in FIG. 14F, the assembly is subjected to heat treatment in a hydrogen-containing reducing atmosphere in order to anneal the undulated upper portion 25 of the single crystal Si layer 23. At the same time, this step gives rise to the effect of reducing the boron concentration in the single crystal silicon layer and smoothing the surface of the assembly.

In a semiconductor substrate obtained by the above-described method of the invention, a flat, uniform and thin single crystal Si film 23 is formed on the entire surface of the second substrate 21 with an insulation layer 22 interposed therebetween. Such a semiconductor substrate can advantageously be used for manufacturing electronic devices that are insulated and isolated from each other.

The residual porous layer left on the surface of separation of the separated first Si single crystal substrate 31 is removed, and the exposed surface is smoothed if it is unacceptably rough. Then, it will be used as a first Si single crystal substrate for another time or as a second substrate 21 to be used subsequently.

No silicon oxide is formed on the rear surface of the substrate 21 in the example of FIGS. 14A through 14F. However, when the substrate 21 itself is made of silicon oxide such as fused quartz, it may be sufficient to form a film of Si, SiC or SiN on the rear surface of the substrate 21 after Step S35, using the silicon film 23 as mask, or annealing the substrate by means of hydrogen, using a tray of SiC or SiC coated carbon.

FIGS. 15A and 15B schematically show the silicon surface of an article before and after a heat treatment process according to the invention.

In FIGS. 15A and 15B, W3 denotes a cross-section of the article before the etching process, whereas W4 denotes a cross-section of the article after the etching process.

If silicon is not located vis-a-vis silicon oxide, silicon-containing gaseous substances that typically include $SiH_2$ and are produced from the silicon surface would not be consumed so that the silicon gasifying reaction, or etching, taking place on the surface will be suppressed once the saturation vapor pressure is reached. Thus, the effect of etching silicon can be suppressed by reducing the rate of gas flow near the silicon film to maintain the vapor pressure of the silicon-containing gaseous substances produced from the silicon surface at a high level.

When a 1 $\mu$m square area was observed through an atomic force microscope before the heat treatment process, the root mean square (Rrms) of surface roughness was about 0.2 nm to 20 nm.

As a result of an etching process according to the invention, the rough surface was smoothed to show an Rrms of as low as about 0.07 nm to 0.15 nm, which corresponds to the surface roughness of a polished Si wafer or a surface that is more smooth than it. In FIGS. 15A and 15B, h denotes the peak to valley distance, p denotes the gap between two adjacent peaks and t denotes the etching depth. In known comparable processes, the thickness t of film 23 will be reduced when the surface of the article is polished and smoothed. However, with a process according to the invention, there will be no reduction in the film thickness because the etching rate can be held to about 0.01 nm at 1,150° C.

According to the invention, after the etching process, the surface roughness is reduced to about one third that of the unetched surface. Thus, a highly undulated silicon surface having a peak to valley distance h as large as several nanometers to tens of several nanometers and a gap between two adjacent peaks p as large as several nanometers to hundreds of several nanometers can be smoothed to show an h value not greater than 2 nm, preferably not greater than 0.4 nm by heat treatment.

This smoothing phenomenon may be explained as a rearrangement of the surface. On a rough surface, there may exist innumerable ridges showing a high energy surface state, and planes with planar bearings of higher orders may be exposed to the surface relative to the planar bearings of the crystal layer. The surface energy of such an area is higher than the surface energy that relies on the planar bearing of the single crystal surface. In a heat treatment process conducted in a hydrogen-containing reducing atmosphere, it may be safely assumed that the energy barrier against the mobilization of surface Si atoms is lowered typically by the reducing effect of hydrogen so that Si atoms excited by thermal energy are mobilized to rearrange the surface into a flat and smooth surface that shows a low energy surface state. The lower the planar bearing index of the single crystal surface, the more the planarizing and smoothing effect of the present invention will be promoted.

Example 1: epitaxial layer transfer/horizontal furnace/SiO$_2$ counter-surface

For each specimen, the surface of a 6-inch boron-doped Si wafer having a specific resistance of 0.015 $\Omega$cm and a (100) orientation was anodized in a solution containing 49% HF and ethyl alcohol mixed in a ratio of 2:1 to produce a 10 $\mu$m thick porous silicon layer on the wafer surface. The silicon wafer was then heat-treated at 400° C. in an oxygen atmosphere for 1 hour. As a result, a very thin oxide film is formed on the surface of the porous layer and also on the wall surfaces of the pores. Subsequently, the silicon wafer was dipped into a 1.25% HF aqueous solution for 30 seconds to remove the very thin oxide film formed on the surface of the porous layer and on the wall surfaces of the pores near the surface. The silicon wafer was then washed well with water and dried. Thereafter, the silicon wafer was placed in an epitaxial growth system and heat-treated at 1,100° C. in a hydrogen atmosphere to close almost all the pores on the surface of the porous silicon. Then, a single crystal silicon film was formed on the porous silicon to an average thickness of 300 nm±5 nm by adding dichlorosilane as a silicon source gas to the hydrogen gas. The silicon wafer was then taken out of the epitaxial growth system and placed in an oxidizing furnace. Thus, the surface of the single crystal silicon film was oxidized to produce a 200 nm thick silicon oxide film using a combustion gas of oxygen and hydrogen. As a result of oxidation, the single crystal silicon film had a thickness of 210 nm. Meanwhile, a second silicon wafer was prepared, and each of the wafers was subjected to a wet cleansing operation that is popularly used in a silicon device process to produce a clean surface (bonding surface). Then, the two silicon wafers were bonded together. The silicon wafer assembly obtained by bonding the two wafers was placed in a heat treatment furnace, where it was heat-treated at 1,100° C. for 1 hour to enhance the bonding strength at the interface. An atmosphere of a mixture of nitrogen and oxygen was used for the heat treatment. Then, the first silicon wafer of the silicon wafer assembly was ground from the rear surface until the porous silicon was exposed. Then, the silicon wafer assembly was dipped into a mixture solution of HF and hydrogen peroxide to etch the porous silicon. The assembly was then subjected to a wet cleansing operation and cleansed well. It was found that the single crystal silicon film had been transferred onto the second silicon wafer with the silicon oxide film to produce an SOI wafer.

The film thickness of the transferred single crystal silicon film was measured at intra-planar 10 mm lattice points to find that the average film thickness was 210 nm with a deviation of ±5 nm. When a 1 $\mu$m square area and a 50 $\mu$m square area of the surface were observed through an atomic force microscope at 256×256 points of measurement, the root mean square of surface roughness (Rrms) was 10.1 nm for the 1 $\mu$m square areas and 9.8 nm for the 50 $\mu$m square areas. When the boron concentration was measured using secondary ion mass spectrography (SIMS), it was found that the boron concentration in the single crystal silicon film was $1.2\times10^{18}/cm^3$.

The silicon oxide formed on the rear surface of the SOI wafer was preliminarily cleansed by hydrofluoric acid and removed by etching. Then, the wafer was placed in a horizontal heat treatment furnace comprising a cylindrical furnace tube made of fused quartz. Gas was made to flow from an end to the other of the furnace tube. The SOI wafer specimens were tested in different modes of arrangement as will be described below. FIGS. 16A through 16E schematically show the different modes of arrangement. Throughout the drawings, 21 denotes a second silicon wafer operation as support substrate, 22 denotes a silicon oxide film which is a buried insulation film and 23 denotes a single crystal silicon film.

Specimen A: FIG. 16A: An SOI wafer W was horizontally placed in the furnace.

Specimen B: FIG. 16B: An SOI wafer W was horizontally placed in the furnace, and a silicon wafer carrying no oxide film thereon was placed above the SOI wafer. The distance separating the two wafers was about 10 mm.

Specimens C, C': FIG. 16C: A pair of SOI wafers is arranged inclinedly and in parallel with each other in the furnace.

Specimens D, D': FIG. 16D: A pair of SOI wafers is vertically arranged in parallel with each other in such a way that the surfaces carrying a single crystal silicon film 23 of the wafers are located vis-a-vis, and the centers of the wafers agree with the center line of the furnace.

Specimens E, E': FIG. 16E: A pair of SOI wafers is vertically arranged in parallel with each other in such a way that the surfaces carrying a single crystal silicon film 23 of the wafers are directed to the upstream, and the centers of the wafers agree with the center line of the furnace. All the wafers were held and supported by respective quartz jigs (not shown).

For each specimen, after replacing the atmosphere in the furnace by hydrogen, the temperature was raised to 1,100° C. and maintained at that level for 4 hours before the temperature was decreased. Then, the atmosphere in the furnace was replaced by nitrogen, and the wafer specimen was taken out to observe the film thickness of the single crystal silicon film. The reduction in the film thickness for each specimen is shown below. The hydrogen gas flow rate was 5 slm. The film thickness was measured at intra-planar 10 mm lattice points, and the obtained values were averaged.

|  | etched height | film thickness | deviation |
|---|---|---|---|
| Specimen A: | 15.2 nm | 193.8 nm | ±9 nm |
| Specimen B: | 3 nm | 206 mm | ±5.2 nm |
| Specimen C: | 10.4 nm | 199.1 nm | ±8 nm (upstream wafer) |
| Specimen C': | 1.7 nm | 208 nm | ±5 nm (downstream wafer) |
| Specimen D: | 1.4 nm | 208.3 nm | ±5 nm (upstream wafer) |
| Specimen D': | 1.2 nm | 208.5 nm | ±5.1 nm (downstream wafer) |
| Specimen E: | 12.4 nm | 197.3 nm | ±8.5 nm (upstream wafer) |
| Specimen E': | 1.1 nm | 208.7 nm | ±5 nm (downstream wafer) |

The decrease in the film thickness of the SOI wafer was less than 2 nm for all the wafers when silicon was used for the counter-surface. On the other hand, when no silicon was used for the counter-surface but the inner surface of the cylindrical furnace tube made of fused quartz was used to operate as a counter-surface, the decrease in the film thickness produced by etching exceeded 10 nm for specimen A, C (upstream wafer) and E (upstream wafer). Thus, by using silicon for the counter-surface, the etched height was reduced to less than ⅕ the loss of height produced when a non-oxidized silicon counter-surface is not used. Variations in the film thickness were not worsened from those observed prior to the heat treatment.

After the above heat treatment, the specimens were observed through an atomic force microscope for surface roughness. The root mean square of surface roughness of specimen is shown below.

|  | 1 μm square area | 50 μm square area |
|---|---|---|
| Specimen A: | 0.11 nm | 0.35 nm |
| Specimen B: | 0.13 nm | 0.36 nm |
| Specimen C': | 0.11 nm | 0.33 nm |
| Specimen D: | 0.13 nm | 0.35 nm (upstream wafer) |
| Specimen D': | 0.13 nm | 0.35 nm (downstream wafer) |
| Specimen E': | 0.12 nm | 0.32 nm |
| marketed Si wafer: | 0.13 nm | 0.31 nm (for reference) |

The above data indicate that the specimen were smoothed to the level of commercially available polished silicon wafers.

After the above heat treatment, the boron concentration of the single crystal silicon film of each of the specimens was observed by secondary ion mass spectrography (SIMS) to find that the boron concentration had been reduced to less than $5 \times 10^{15}/cm^3$ to prove that the specimen could feasibly be used for manufacturing electron ic devices.

Example 2: epitaxial layer transfer/vertical furnace/various boats/oxide film rear surface For each specimen, the surface of an 8-inch boron-doped Si wafer having a specific resistance of 0.017 Ωcm and a (100) orientation was anodized in a solution containing 49% HF and ethyl alcohol mixed in a ratio of 2:1 to produce a 10 μm thick porous silicon layer on the wafer surface. The silicon wafer was then heat-treated at 400° C. in an oxygen atmosphere for 1 hour and subsequently dipped into a 1.25% HF aqueous solution for 30 seconds to remove the very thin oxide film formed on and near the surface of the porous silicon layer. The silicon wafer was then washed well with water and dried. Thereafter, the silicon wafer was placed in an epitaxial growth system and heat-treated at 1,100° C. in a hydrogen atmosphere by adding silane gas at a very small rate to close almost all the pores on the surface of the porous silicon. Then, a single crystal silicon film was formed on the porous silicon to an average thickness of 310 nm±5 nm by adding silane as silicon source gas to the hydrogen gas. The silicon wafer was then taken out of the epitaxial growth system and placed in an oxidizing furnace. Thus, the surface of the single crystal silicon film was oxidized to produce a 200 nm thick silicon oxide film by means of combustion gas of oxygen and hydrogen. As a result of oxidation, the single crystal silicon film had a thickness of 210 nm. Meanwhile, a second silicon wafer was subjected to a thermal oxidation process to form a 200 nm thick silicon oxide film on the entire surface thereof, and each of the wafers was subjected to a wet cleansing operation that is popularly used in a silicon device process to produce a clean surface. Then, the two silicon wafers were bonded together. The silicon wafer assembly obtained by bonding the two wafers was placed in a heat treatment furnace, where it was heat-treated at 1,100° C. for 1 hour to enhance the bonding strength at the interface. The temperature of the atmosphere of the heat treatment was raised in a gaseous mixture of nitrogen and oxygen and then replaced with a combustion gas of oxygen and nitrogen. The temperature was maintained at 1,100° C. for 1 hour and then lowered in a nitrogen atmosphere. Then, the first silicon wafer of the silicon wafer assembly was ground from the rear surface until the porous silicon was exposed. Then, the silicon wafer assembly was dipped into a mixture solution of HF and hydrogen peroxide to etch the porous silicon. The assembly was then subjected to a wet cleansing operation and cleansed well. It was found that the single crystal silicon film had been transferred onto the second silicon wafer with the silicon oxide film to produce an SOI wafer.

The film thickness of the transferred single crystal silicon film was measured at intra-planar 10mm lattice points to find that the average film thickness was 210 nm with a deviation of ±4.3 nm. When a 1 μm square area and a 50 μm square area of the surface were observed through an atomic force microscope at 256×256 points of measurement, the root mean square (Rrms) of surface roughness was 10.1 nm for the 1 μm square areas and 9.8 nm for the 50 μm square areas. When the boron concentration was measured by means of secondary ion mass spectrography (SIMS), it was found that the boron concentration in the single crystal silicon film was $1.2 \times 10^{18}/cm^3$.

The obtained SOI wafers were placed in a vertical heat treatment furnace comprising a furnace tube made of quartz and having a configuration as shown in FIG. 9 without removing the silicon oxide film on the rear surface. Gas was made to flow from above to below in the furnace.

A commercially available bulk Si 8-inch wafer was used as counter-surface constituting member. As shown in FIG. 9, the wafers W were arranged horizontally on a SiC boat 4 in such a way that the silicon oxide rear surface of each of the SOI wafers faced the surface of the SOI layer of the SOI wafer located directly below it, and the oppositely disposed surfaces are separated by a gap of 6 mm, the center of each of the wafers agreeing with the center line of the furnace tube. A bulk Si 8-inch wafer 3 was arranged on top of the SOI wafers, using the above-described gap to separate it from the top SOI wafer. After replacing the atmosphere in the furnace with hydrogen, the temperature in the furnace was raised to 1,100° C. and maintained at that level for 4 hours before the temperature was lowered to take out the wafers and observe the film thickness of the SOI of each specimen. The decrease in the film thickness of each of the SOI wafers was not greater than 1 nm.

Then, the boat supporting the wafers was replaced by a boat made of vitreous silica, and a similar experiment was conducted to find that one of the wafers W had been etched by 8 nm at maximum in an area supported by the boat, although the etched height was less than 1nm in the central area of all of the wafers as in the case of the use of an SiC boat. Thus, it was found that a boat having a surface of non-oxidized silicon, $SiO_2$ for example, is preferably used for the purpose of the invention.

When the silicon oxide film on the rear surface of each of the wafers was not removed before the heat treatment so that the SOI layer was made to face a silicon oxide rear surface and heat-treated in a hydrogen atmosphere as in the above experiment, the decrease in the film thickness of the SOI layer facing another SOI wafer was as large as 9 nm and only the SOI wafer facing the uppermost silicon wafer showed a decrease of less than 1 nm in the film thickness by etching. In short, the etching effect could be suppressed to about 1/10 by using silicon for the counter-surface.

Figure 17:
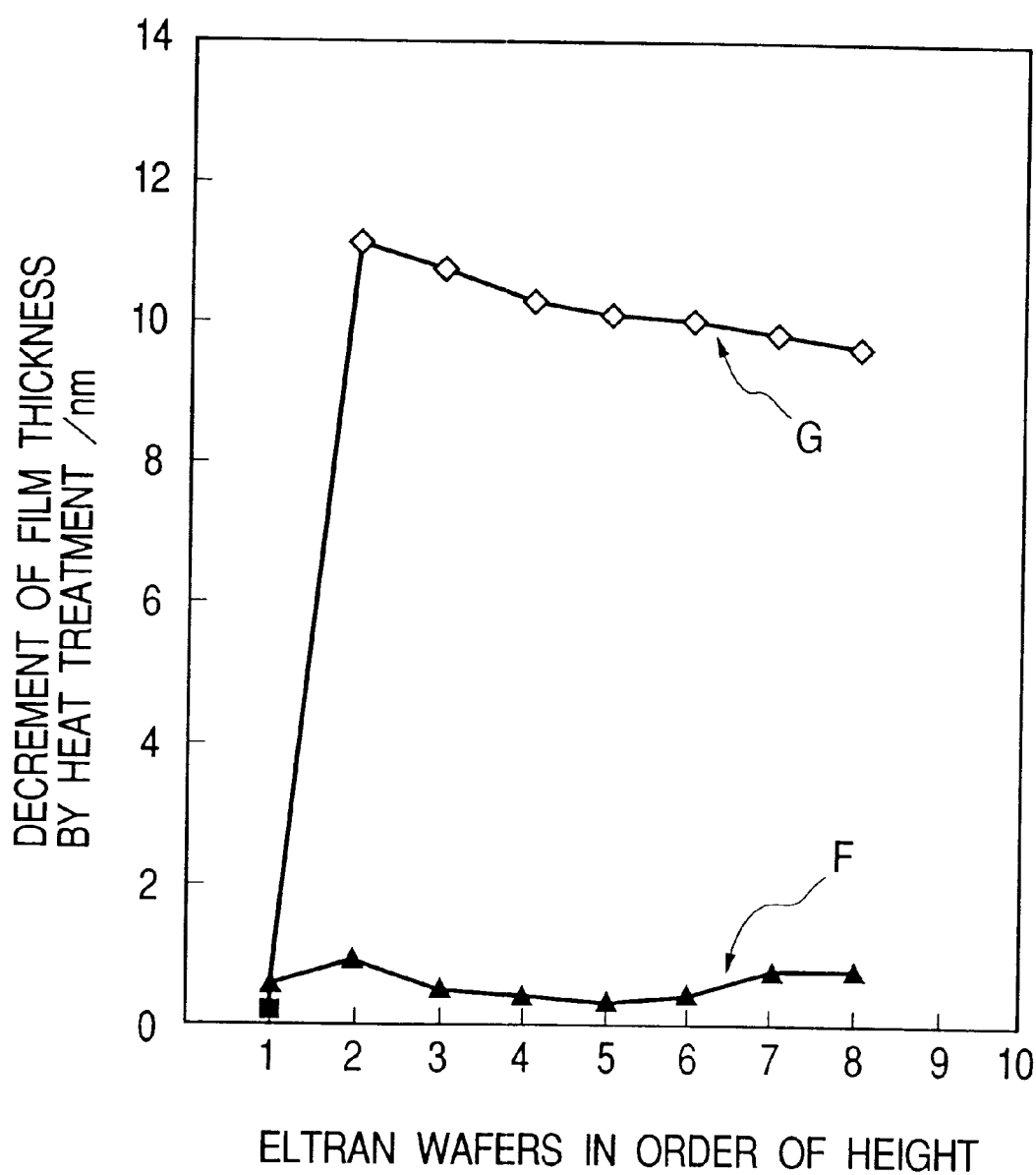
FIG. 17 is a graph illustrating the location dependency of the film thickness reduction in the furnace in a heat treatment process according to the invention.

FIG. 17 shows the result of the above experiment. More specifically, FIG. 17 shows the location dependency of the film thickness reduction of the SOI layer of wafers in the furnace in a heat treatment process according to the invention. In FIG. 17, the horizontal axis represents the numerical order of arrangement of the wafers in the furnace as counted from above and the vertical axis represents the decrease (nm) in the film thickness due to heat treatment. In FIG. 17, F denotes the data obtained when the silicon oxide film on the rear surface of each SOI wafer had been removed before the SOI layer of the wafer was arranged vis-a-vis the silicon rear surface of another SOI wafer, and G denotes the data obtained for comparison when the SOI layer of each SOI wafer was arranged vis-a-vis the silicon oxide rear surface of another SOI wafer that had not been removed. Note that a silicon wafer (dummy wafer) was arranged above the first SOI wafer in order to maintain the high temperature in the furnace, and therefore the front surface of the first SOI wafer was facing the silicon rear surface of the dummy wafer.

As seen from FIG. 17, the decrease in the film thickness was less than 1 nm only for the first SOI wafer arranged vis-a-vis a dummy Si wafer and about 10 nm for all the SOI layers of the remaining SOI wafers when the silicon oxide was not removed from the rear surface.

After the heat treatment, the specimens were observed through an atomic force microscope for surface roughness. The root mean square of surface roughness (Rrms) of each of the specimens was 0.11 nm for a 1 µm square area and 0.35 nm for a 50 µm square area, thereby indicating that the specimens had been smoothed to the level of commercially available silicon wafers. After the heat treatment, the boron concentration of the single crystal silicon film of each of the specimens was observed by secondary ion mass spectrog-raphy (SIMS) to find that the boron concentration had been reduced to less than $5\times10^{15}/cm^3$ to prove that the specimen could feasibly be used for manufacturing electronic devices.
Example 3: epitaxial layer transfer/vertical furnace/quartz tray For each specimen, the surface of an 8-inch boron-doped Si wafer having a specific resistance of 0.017 Ωcm and a (100) orientation was anodized in a solution containing 49% HF and ethyl alcohol mixed in a ratio of 2:1 to produce a 10 µm thick porous silicon layer on the wafer surface. The silicon wafer was then heat-treated at 400° C. in an oxygen atmosphere for 1 hour and subsequently dipped into a 1.25% HF aqueous solution for 30 seconds to remove the very thin oxide film formed on and near the surface of the porous silicon layer. The silicon wafer was then washed well with water and dried. Thereafter, the silicon wafer was placed in an epitaxial growth system and heat-treated at 1,100° C. in a hydrogen atmosphere to close almost all the pores on the surface of the porous silicon. Then, a single crystal silicon film was formed on the porous silicon to an average thickness of 310 nm±5 nm by adding dichlorosilane as a silicon source gas to the hydrogen gas. The silicon wafer was then taken out of the epitaxial growth system and placed in an oxidizing furnace. Thus, the surface of the single crystal silicon film was oxidized to produce a 200 nm thick silicon oxide film by means of a combustion gas of oxygen and hydrogen. As a result of oxidation, the single crystal silicon film had a thickness of 210 nm. This wafer and a second wafer of 200 nm were separately subjected to a wet cleansing operation that is popularly used in a silicon device process to produce a clean surface. Then, the two silicon wafers were bonded together. The silicon wafer assembly obtained by bonding the two wafers was placed in a heat treatment furnace, where it was heat-treated at 1,100° C. for 1 hour to enhance the bonding strength at the interface. A gaseous mixture of nitrogen and oxygen was used for the atmosphere of the heat treatment and heated before it was replaced by the combustion gas of oxygen and hydrogen and held to 1,100° C. Thereafter, the temperature was lowered in a nitrogen atmosphere. Then, the first silicon wafer of the silicon wafer assembly was ground from the rear surface until the porous silicon was exposed. Then, the silicon wafer assembly was dipped into a mixture solution of HF and hydrogen peroxide to etch the porous silicon. The assembly was then subjected to a wet cleansing operation and cleansed well. The single crystal silicon film produced by epitaxial growth had been transferred onto the second silicon wafer with the silicon oxide film to produce an SOI wafer.

For each specimen, the film thickness of the transferred single crystal silicon film was measured at intra-planar 10 mm lattice points to find that the average film thickness was 210 nm with a deviation of ±7 nm. When a 1 µm square area and a 50 µm square area of the surface were observed through an atomic force microscope at 256×256 points of measurement, the root mean square (Rrms) of surface roughness was 10.1 nm for the 1 µm square areas and 9.8 nm for the 50 µm square areas. When the boron concentration was measured by means of secondary ion mass spectrography (SIMS), it was found that the boron concentration in the single crystal silicon film was $1.2\times10^{18}$ $cm^3$.

All the obtained SOI wafers were placed on respective SiC trays as shown in FIG. 7 and put into a vertical heat treatment furnace shown in FIG. 9 and comprising a furnace tube made of fused quartz with a loading chamber. Inert gas was introduced into the loading chamber in which the wafers and trays were placed. Inert gas was made to flow from above to below in the furnace. The wafers were transferred from the loading chamber to the furnace without exposing the inside of the furnace to the oxidizing atomosphere. The wafers were arranged horizontally on the respective SiC trays in such a way that the rear surface of each of the trays supporting an SOI wafer thereon faced the surface of the SOI layer of the SOI wafer located directly below it, and the oppositely disposed surfaces are separated by a gap of 6 mm, the center of each of the wafers agreeing with the center line of the furnace tube. A commercially available silicon wafer 3 was arranged on a tray, which was then placed on top of the SOI wafers, using the above-described gap to separate it from the top SOI wafer. After replacing the atmosphere in the furnace with hydrogen, the temperature in the furnace was raised to 1,180° C. and maintained at that level for 1 hour before the temperature was lowered to take out the wafers and observe the film thickness of the SOI of each specimen again. The decrease in the film thickness of each of the SOI wafers was less than 1nm for all the SOI wafers.

On the other hand, after a similar heat treatment operation conducted also in a hydrogen atmosphere where the SiC trays were replaced with $SiO_2$ trays and the SOI layer of each SOI wafer was made to face silicon oxide, it was found that the decrease in the film thickness of the SOI layer facing an SOI wafer was as large as 40 nm.

Thus, although the wafers did not carry a silicon oxide film on the rear surface, the silicon layer was etched as a result of using a quartz tray for each specimen to provide a counter-surface for the wafer located immediately therebelow.

After the heat treatment, the specimens were observed through an atomic force microscope for surface roughness. The root mean square of surface roughness (Rrms) of each of the specimens was 0.11 nm for a 1 $\mu$m square area and 0.30 nm for a 50 $\mu$m square area, thereby indicating that the specimens had been smoothed to the level of commercially available silicon wafers. After the heat treatment, the boron concentration of the single crystal silicon film of each specimen was observed by secondary ion mass spectrography (SIMS) to find that the boron concentration had been reduced to less than $1 \times 10^{15}/cm^3$ to prove that the specimen could feasibly be used for manufacturing electronic devices.
Example 4: WJ separation/epitaxial layer transfer For each specimen, the surface of an 8-inch boron-doped Si wafer having a specific resistance of 0.017 $\Omega$cm and a (100) orientation was anodized in a solution containing 49% HF and ethyl alcohol mixed in a ratio of 2:1 to produce a 6 $\mu$m thick porous silicon layer on the wafer surface. To be more accurate, the porous silicon layer included a 1 $\mu$m thick highly porous layer having a porosity of about 60% and a 5 $\mu$m thick less porous layer having a porosity of 20% located on the highly porous layer, which layers were produced by varying the electric current. The silicon wafer was then heat-treated at 400° C. in an oxygen atmosphere for 1 hour and subsequently dipped into a 1.25% HF aqueous solution for 30 seconds to remove the very thin oxide film formed on the surface of the less porous layer and the wall surfaces of the pores located near that surface. The silicon wafer was then washed well with water and dried. Thereafter, the silicon wafer was placed in an epitaxial growth system and heat-treated at 1,100° C. in a hydrogen atmosphere by adding silane gas at a very small rate to close almost all the pores on the surface of the porous silicon. Then, a single crystal silicon film was formed on the porous silicon to an average thickness of 310 nm±5 nm by adding dichlorosilane as a silicon source gas to the hydrogen gas. The silicon wafer was then taken out of the epitaxial growth system and placed in an oxidizing furnace. Thus, the surface of the single crystal silicon film was oxidized to produce a 200 nm thick silicon oxide film by means of a combustion gas of oxygen and hydrogen. As a result of oxidation, the single crystal silicon film had a thickness of 210 nm. Meanwhile, a second silicon wafer was subjected to a thermal oxidation process to form a 200 nm thick silicon oxide film on the entire surface thereof, and each of the wafers was subjected to a wet cleansing operation that is popularly used in a silicon device process to produce a clean surface. Then, the two silicon wafers were bonded together. The silicon wafer assembly obtained by bonding the two wafers was placed in a heat treatment furnace, where it was heat-treated at 1,100° C. for 1 hour to enhance the bonding strength at the interface. An atmosphere of a mixture of nitrogen and oxygen was used for the heat treatment. Then, the silicon wafer assembly was separated along the highly porous layer under the fluid wedge effect by applying a high pressure water jet stream to a lateral side of the assembly to expose the porous layer. Then, the second silicon wafer was dipped into a mixture solution of HF and hydrogen peroxide to remove the residual porous silicon by selective etching. It was then subjected to a wet cleansing operation and cleansed well. It was found that the single crystal silicon film had been transferred onto the second silicon wafer with the silicon oxide film to produce an SOI wafer.

For each specimen, the film thickness of the transferred single crystal silicon film was measured at intra-planar 10 mm lattice points to find that the average film thickness was 210 nm with a deviation of ±7 nm. When a 1 $\mu$m square area and a 50 $\mu$m square area of the surface were observed through an atomic force microscope at 256×256 points of measurement, the root mean square (Rrms) of surface roughness was 10.1 nm for the 1pm square areas and 9.8 nm for the 50 $\mu$m square areas. When the boron concentration was measured by means of secondary ion mass spectrography (SIMS), it was found that the boron concentration in the single crystal silicon film was $1.2 \times 10^{18}/cm^3$.

The silicon oxide film on the rear surface of all the obtained SOI wafers was etched in advance by means of hydrofluoric acid, and the SOI wafers were put into a vertical heat treatment furnace comprising a furnace tube made of fused quartz. Gas was made to flow from above to below in the furnace. The wafers were arranged horizontally on a SiC boat as shown in FIG. 9 in such a way that the rear surface of each of the SOI wafers faced the surface of the SOI layer of the SOI wafer located directly below it, and the oppositely disposed surfaces are separated by a gap of about 6 mm, the center of each of the wafers agreeing with the center line of the furnace tube. A commercially available bulk silicon wafer from which the natural silicon film, if any, had been removed was arranged on top of the SOI wafers, using the above-described gap to separate it from the top SOI wafer. After replacing the atmosphere in the furnace with hydrogen, the temperature in the furnace was raised to 1,100° C. and maintained at that level for 4 hours before the temperature was lowered to take out the wafers and observe the film thickness of the SOI of each specimen again. The decrease in the film thickness of each of the SOI wafers was less than 1nm.

When the silicon oxide film on the rear surface of each of the wafers was not removed before the heat treatment so that the SOI layer was made to face a silicon oxide rear surface and heat-treated in a hydrogen atmosphere as in the above experiment, the decrease in the film thickness of the SOI layer facing another SOI wafer was as large as 9 nm, and only the SOI wafer facing the uppermost silicon wafer showed a decrease of less than 1 nm in the film thickness by etching. In short, the etching effect could be suppressed to about ⅒ by using silicon for the counter-surface.

After the heat treatment, the specimens were observed through an atomic force microscope for surface roughness. The root mean square of surface roughness (Rrms) of each of the specimens was 0.12 nm for a 1 μm square area and 0.34 nm for a 50 μm square area, thereby indicating that the specimens had been smoothed to the level of commercially available silicon wafers. After the heat treatment, the boron concentration of the single crystal silicon film of each specimen was observed by secondary ion mass spectrography (SIMS) to find that the boron concentration had been reduced to less than $5 \times 10^{15}/cm^3$ to prove that the specimen could feasibly be used for manufacturing electronic devices.

Example 5: BESOI/vertical furnace/SiC boat

For each specimen, an 8-inch boron-doped Si wafer having a specific resistance of 0.007 Ωcm and a (100) orientation was placed in an epitaxial growth system and heat-treated at 1,100° C. in a hydrogen atmosphere. After lowering the temperature to 900° C., a single crystal silicon film was produced to an average film thickness of 310 nm±5 nm using hydrogen gas, to which dichlorosilane was added as a silicon source gas. The silicon wafer was then taken out of the epitaxial growth system and placed in an oxidizing furnace. Thus, the surface of the single crystal silicon film was oxidized to produce a 200 nm thick silicon oxide film by means of a combustion gas of oxygen and hydrogen. As a result of oxidation, the single crystal silicon film had a thickness of 210 nm. Meanwhile, a second silicon wafer was subjected to a thermal oxidation process to form a 200 nm thick silicon oxide film on the entire surface thereof, and each of the wafers was subjected to a wet cleansing operation that is popularly used in a silicon device process to produce a clean surface. After activating the surfaces (bonding surfaces) of the wafers by means of an oxygen plasma process, the two silicon wafers were washed with water and bonded together. The silicon wafer assembly obtained by bonding the two wafers was placed in a heat treatment furnace, where it was heat-treated at 400° C. for 10 hours to enhance the bonding strength at the interface. A nitrogen atmosphere was used for the heat treatment. Then, the silicon wafer assembly was scraped from the rear surface of the first silicon wafer until the thickness of the first silicon wafer was reduced to about 5 μm. Subsequently, the P⁺ layer was selectively etched by dipping the silicon wafer assembly in a 1:3:8 mixture solution of hydrofluoric acid, nitric acid and acetic acid. The single crystal silicon film had been transferred onto the second silicon wafer with the silicon oxide film to produce an SOI wafer.

For each specimen, the film thickness of the transferred single crystal silicon film was measured at intra-planar 10 mm lattice points to find that the average film thickness was 210 nm with a deviation of ±20 nm. When a 1 μm square area and a 50 μm square area of the surface were observed through an atomic force microscope at 256×256 points of measurement, the root mean square (Rrms) of surface roughness was 2 nm for the 1 μm square areas and 2.2 nm for the 50 μm square areas.

The silicon oxide film on the rear surface of all the obtained SOI wafers was etched in advance by means of hydrofluoric acid, and the SOI wafers were put into a vertical heat treatment furnace comprising a furnace tube made of fused quartz. Gas was made to flow from above to below in the furnace. The wafers were arranged horizontally on a SiC boat as shown in FIG. 9 in such a way that the rear surface of each of the SOI wafers faced the surface of the SOI layer of the SOI wafer located directly below it, and the oppositely disposed surfaces are separated by a gap of about 6 mm, the center of each of the wafers agreeing with the center line of the furnace tube. A commercially available bulk silicon wafer from which the natural silicon film, if any, had been removed was arranged on top of the SOI wafers, using the above-described gap to separate it from the top SOI wafer. After replacing the atmosphere in the furnace with hydrogen, the temperature in the furnace was raised to 1,100° C. and maintained at that level for 4 hours before the temperature was lowered to take out the wafers and observe the film thickness of the SOI of each specimen again. The decrease in the film thickness of each of the SOI wafers was less than 1 nm.

After the heat treatment, the specimens were observed through an atomic force microscope for surface roughness. The root mean square of surface roughness (Rrms) of each of the specimens was 0.11 nm for a 1 μm square area and 0.35 nm for a 50 μm square area, thereby indicating that the specimens had been smoothed to the level of commercially available silicon wafers. After the heat treatment, the boron concentration of the single crystal silicon film of each of the specimens was observed by secondary ion mass spectrography (SIMS) to find that the boron concentration had been reduced to less than $5 \times 10^{15}/cm^3$ to prove that the specimen could feasibly be used for manufacturing electronic devices.

Example 6: cleave process by hydrogen ion implantation/vertical furnace/SiC boat For each specimen, the surface of an 8-inch boron-doped Si wafer having a specific resistance of 10 Ωcm and a (100) orientation was oxidized by 400 nm, and hydrogen ions were implanted into the wafer under the conditions of 50 KeV and $4 \times 10^{16}/cm^2$. The silicon wafer and a second silicon wafer were separately subjected to a wet cleansing operation that is popularly used in a silicon device process to produce a clean surface (bonding surface). Then, the two silicon wafers were bonded together. The silicon wafer assembly obtained by bonding the two wafers was placed in a heat treatment furnace, where it was heat-treated at 800° C. for 10 hours in a heat treatment furnace to enhance the bonding strength at the interface. A nitrogen atmosphere was used for the heat treatment. During the heat treatment, the silicon wafer assembly was separated along the depth corresponding to the projection range of implanted ions. The single crystal silicon film had been transferred onto the second silicon wafer with the silicon oxide film to produce an SOI wafer.

For each specimen, the film thickness of the transferred single crystal silicon film was measured at intra-planar 10 mm lattice points to find that the average film thickness was 210 nm with a deviation of ±10 nm. When a 1 μm square area and a 50 μm square area of the surface were observed through an atomic force microscope at 256×256 points of measurement, the root mean square (Rrms) of surface roughness was 9.4 nm for the 1 μm square areas and 8.5 nm for the 50 μm square areas.

The silicon oxide film on the rear surface of all the obtained SOI wafers was etched in advance by means of hydrofluoric acid, and the SOI wafers were put into a vertical heat treatment furnace comprising a furnace tube made of fused quartz. Gas was made to flow from above to below in the furnace. The wafers were arranged horizontally on a SiC boat as shown in FIG. 9 in such a way that the rear surface of each of the SOI wafers faced the surface of the SOI layer of the SOI wafer located directly below it, and the oppositely disposed surfaces are separated by a gap of about 6 mm, the center of each of the wafers agreeing with the center line of the furnace tube. A commercially available bulk silicon wafer from which the natural silicon film, if any, had been removed was arranged on top of the SOI wafers, using the above-described gap to separate it from the top SOI wafer. After replacing the atmosphere in the furnace with hydrogen, the temperature in the furnace was raised to 1,150° C. and maintained at that level for 1.5 hours before the temperature was lowered to take out the wafers and observe the film thickness of the SOI of each specimen again. The decrease in the film thickness of each of the SOI wafers was less than 1 nm.

After the heat treatment, the specimens were observed through an atomic force microscope for surface roughness. The root mean square of surface roughness (Rrms) of each specimen was 0.11 nm for a 1 μm square area and 0.35 nm for a 50 μm square area, thereby indicating that the specimens had been smoothed to the level of commercially available silicon wafers. After the heat treatment, the boron concentration of the single crystal silicon film of each of the specimens was observed by secondary ion mass spectrography (SIMS) to find that the boron concentration had been reduced to less than $5 \times 10^{15}/cm^3$ to prove that the specimen could feasibly be used for manufacturing electronic devices.

Example 7: SIMOX/vertical furnace/SiC boat

For each specimen, oxygen ions were implanted into the surface of an 8-inch boron-doped Si wafer having a specific resistance of 10 Ωcm and a (100) orientation under the conditions of 550° C., 180 KeV and $4 \times 10^{17}/cm^2$. The silicon wafer was placed in a heat treatment furnace and heat-treated in a mixture gas of $Ar+O_2$ at 1,350° C. for 20 hours to produce a buried oxide film.

For each specimen, the film thickness of the transferred single crystal silicon film formed on the buried oxide film was measured at intra-planar 10 mm lattice points to find that the average film thickness was 200 nm with a deviation of ±10 nm. When a 1 μm square area and a 50 μm square area of the surface were observed through an atomic force microscope at 256×256 points of measurement, the root mean square (Rrms) of surface roughness was 0.5 nm for the 1 μm square areas and 2 nm for the 50 μm square areas to prove that the surface roughness was increased by the oxygen ion implantation. When the boron concentration was measured by means of secondary ion mass spectrography (SIMS), it was found that the boron concentration in the single crystal silicon film was $5 \times 10^{17}/cm^3$ for all the specimens.

The silicon oxide film on the rear surface of all the obtained SOI wafers was etched in advance by means of hydrofluoric acid, and the SOI wafers were put into a vertical heat treatment furnace comprising a furnace tube made of fused quartz. Gas was made to flow from above to below in the furnace. The wafers were arranged horizontally on a SiC boat as shown in FIG. 9 in such a way that the rear surface of each of the SOI wafers faced the surface of the SOI layer of the SOI wafer located directly below it, and the oppositely disposed surfaces are separated by a gap of about 6 mm, the center of each of the wafers agreeing with the center line of the furnace tube. A commercially available bulk silicon wafer from which the natural silicon film, if any, had been removed was arranged on top of the SOI wafers, using the above-desribed gap to separate it from the top SOI wafer. After replacing the atmosphere in the furnace with hydrogen, the temperature in the furnace was raised to 1,150° C. and maintained at that level for 1.5 hours before the temperature was lowered to take out the wafers and observe the film thickness of the SOI of each specimen again. The decrease in the film thickness of each of the SOI wafers was less than 1 nm.

After the heat treatment, the specimens were observed through an atomic force microscope for surface roughness. The root mean square of surface roughness (Rrms) of each specimen was 0.3 nm for a 1 μm square area and 1.5 nm for a 50 μm square area, thereby indicating that the specimens had been smoothed to the level of commercially available silicon wafers. After the heat treatment, the boron concentration of the single crystal silicon film of each of the specimens was observed by secondary ion mass spectrography (SIMS) to find that the boron concentration had been reduced to less than $5 \times 10^{15}/cm^3$ to prove that the specimen could feasibly be used for manufacturing electronic devices.

Example 8: non-porous layer transfer/vertical furnace/SiC boat

For each specimen, the surface of an 8-inch boron-doped Si wafer having a specific resistance of 0.017 Ωcm and a (100) orientation was anodized in a solution containing 49% HF and ethyl alcohol mixed in a ratio of 2:1 to produce a 10 μm thick porous silicon layer on the wafer surface. The silicon wafer was then heat-treated at 400° C. in an oxygen atmosphere for 1 hour and subsequently dipped into a 1.25% HF aqueous solution for 30 seconds to remove the very thin oxide film formed on and near the surface of the porous silicon layer. The silicon wafer was then washed well with water and dried. Thereafter, the silicon wafer was placed in a vertical heat treatment furnace and heat-treated at 1,100° C. in a hydrogen atmosphere to close almost all the pores on the surface of the porous silicon and form a very thin non-porous single crystal silicon film on the surface by modifying the surface of the porous layer to be non-porous. This silicon wafer and a second silicon wafer that had been subjected to a thermal oxidation process to form a 200 nm thick silicon oxide film on the entire surface thereof were then separately subjected to a wet cleansing operation that is popularly used in a silicon device process to produce a clean surface. Thereafter, the two silicon wafers were cleansed in a wet cleansing process to produce clean surfaces and bonded together. The silicon wafer assembly obtained by bonding the two wafers was placed in a heat treatment furnace, where it was heat-treated at 1,100° C. for 1 hour to enhance the bonding strength at the interface. A gaseous mixture of nitrogen and oxygen was used for the atmosphere of heat treatment and heated before it was replaced by a combustion gas of oxygen and hydrogen and maintained at 1,100° C. for 1 hour. Thereafter, the temperature was lowered in a nitrogen atmosphere. Then, the silicon wafer assembly was scraped from the rear surface of the first silicon wafer to expose the porous silicon. Then, the silicon wafer assembly was dipped into a mixture solution of HF and hydrogen peroxide to etch the porous silicon layer. It was then subjected to a wet cleansing operation and cleansed well. It was found that the non-porous single crystal silicon film had been transferred onto the second silicon wafer with the silicon oxide film to produce an SOI wafer.

For each specimen, the film thickness of the transferred single crystal silicon film was measured at intra-planar 10 mm lattice points to find that the average film thickness was 10 nm. When a 1 μm square area and a 50 μm square area of the surface were observed through an atomic force microscope at 256×256 points of measurement, the root mean square (Rrms) of surface roughness was 10.1 nm for the 1 μm square areas and 9.8 nm for the 50 μm square areas.

The silicon oxide film on the rear surface of all the obtained SOI wafers was etched in advance by means of hydrofluoric acid, and the SOI wafers were put into a vertical heat treatment furnace comprising a furnace tube made of fused quartz. Gas was made to flow from above to below in the furnace. The wafers were arranged horizontally on a SiC boat as shown in FIG. 9 in such a way that the rear surface of each of the SOI wafers faced the surface of the SOI layer of the SOI wafer located directly below it, and the oppositely disposed surfaces are separated by a gap of about 6 mm, the center of each of the wafers agreeing with the center line of the furnace tube. A commercially available bulk silicon wafer from which the natural silicon film, if any, had been removed was arranged on top of the SOI wafers, using the above-desribed gap to separate it from the top SOI wafer. After replacing the atmosphere in the furnace with hydrogen, the temperature in the furnace was raised to 1100° C. and maintained at that level for 4 hours before the temperature was lowered to take out the wafers and observe the film thickness of the SOI of each specimen again. The decrease in the film thickness of each of the SOI wafers was less than 1 nm.

When the silicon oxide film on the rear surface of each of the wafers was not removed before the heat treatment so that the SOI layer was made to face the silicon oxide on the rear surface of a wafer and heat-treated in a hydrogen atmosphere as in the above experiment, the decrease in the film thickness of the SOI layer facing another SOI wafer was as large as 5 nm and scattered pit-like spots of unetched silicon oxide were observed. Only the SOI wafer facing the uppermost silicon wafer showed a decrease of less than 1 nm in the film thickness by etching and were free from pit-like spots. In short, the etching effect could be suppressed, and the generation of pit-like spots could be eliminated by using silicon for the counter-surface.

Example 9: epitaxial layer transfer on vitreous silica/horizontal furnace/SiC tray For each specimen, the surface of an 8-inch boron-doped Si wafer having a specific resistance of 0.017 Ωcm and a (100) orientation was anodized in a solution containing 49% HF and ethyl alcohol mixed in a ratio of 2:1 to produce a 10 μm thick porous silicon layer on the wafer surface. The silicon wafer was then heat-treated at 400° C. in an oxygen atmosphere for 1 hour and subsequently dipped into a 1.25% HF aqueous solution for 30 seconds to remove the very thin oxide film formed on and near the surface of the porous silicon layer. The silicon wafer was then washed well with water and dried. Thereafter, the silicon wafer was placed in an epitaxial growth system and heat-treated at 1,100° C. in a hydrogen atmosphere, adding silane gas at a very small rate, to close almost all the pores on the surface of the porous silicon layer. Then, a single crystal silicon film was formed on the porous silicon to an average thickness of 310 nm±5 nm by adding dichlorosilane as a silicon source gas to the hydrogen gas. The silicon wafer was then taken out of the epitaxial growth system and placed in an oxidizing furnace. Thus, the surface of the single crystal silicon film was oxidized to produce a 200 nm thick silicon oxide film by means of a combustion gas of oxygen and hydrogen. As a result of oxidation, the single crystal silicon film had a thickness of 210 nm. Then, this silicon wafer and a second silicon wafer on which a silicon oxide film was formed by thermal oxidation to a thickness of 200 nm over the entire surface were separately subjected to a wet cleansing operation that is popularly used in a silicon device process to produce a clean surface (bonding surface). The surfaces (bonding surfaces) were activated by nitrogen plasma before they were washed with water and dried. The two silicon wafers were then bonded together. The silicon wafer assembly obtained by bonding the two wafers was placed in a heat treatment furnace, where it was heat-treated at 400° C. for 10 hours to enhance the bonding strength at the interface. Then, the silicon wafer assembly was scraped from the rear surface of the first silicon wafer to expose the porous silicon layer. Then, the silicon wafer assembly was dipped into a mixture solution of HF and hydrogen peroxide to etch the porous silicon. It was then subjected to a wet cleansing operation and cleansed well. It was found that the single crystal silicon film had been transferred onto the second silicon wafer with the silicon oxide film to produce an SOI wafer.

For each specimen, the film thickness of the transferred single crystal silicon film was measured at intra-planar 10 mm lattice points to find that the average film thickness was 210 nm with a deviation of ±7 nm. When a 1 μm square area and a 50 μm square area of the surface were observed through an atomic force microscope at 256×256 points of measurement, the root mean square (Rrms) of surface roughness was 10.1 nm for the 1 μm square areas and 9.8 nm for the 50 μm square areas. When the boron concentration was measured by means of secondary ion mass spectrography (SIMS), it was found that the boron concentration in the single crystal silicon film was $1.2 \times 10^{18}/cm^3$.

All the obtained SOI wafers were placed on respective SiC trays 31 as shown in FIG. 7 and put into a vertical heat treatment furnace shown in FIG. 9 and comprising a furnace tube made of fused quartz. Gas was made to flow from above to below in the furnace. The wafers were arranged horizontally on the respective SiC trays in such a way that the rear surface of each of the trays supporting an SOI wafer thereon faced the surface of the SOI layer of the SOI wafer located directly below it, and the oppositely disposed surfaces are separated by a gap of 6 mm, the center of each of the wafers agreeing with the center line of the furnace tube. A commercially available silicon wafer 3 was arranged on a tray, which was then placed on top of the SOI wafers, using the above-described gap to separate it from the top SOI wafer. After replacing the atmosphere in the furnace with hydrogen, the temperature in the furnace was raised to 1,000° C. and maintained at that level for 15 hours before the temperature was lowered to take out the wafers and observe the film thickness of the SOI layer of each specimen again. The decrease in the film thickness of each of the SOI wafers was less than 1 nm for all the SOI wafers.

After the heat treatment, the specimens were observed through an atomic force microscope for surface roughness. The root mean square of surface roughness (Rrms) of each of the specimens was 0.11 nm for a 1 μm square area and 0.50 nm for a 50 μm square area, thereby indicating that the specimens had been smoothed to the level of commercially available silicon wafers. After the heat treatment, the boron concentration of the single crystal silicon film of each of the specimens was observed by secondary ion mass spectrography (SIMS) to find that the boron concentration had been reduced to less than $1 \times 10^{16}/cm^3$ to prove that the specimen could feasibly be used for manufacturing electronic devices.

Example 10: WJ separation/epitaxial layer transfer/vertical furnace

For each specimen, the surface of an 8-inch boron-doped Si wafer having a specific resistance of 0.017 Ωcm and a (100) orientation was anodized in a solution containing 49% HF and ethyl alcohol mixed in a ratio of 2:1 to produce a 3 μm thick porous silicon layer on the wafer surface. To be more accurate, the porous silicon layer included a 2 μm thick highly porous layer having a porosity of about 45% and a 1 μm thick less porous layer having a porosity of 20% located on the highly porous layer, which layers were produced by varying the electric current. The silicon wafer was then heat-treated at 400° C. in an oxygen atmosphere for 1 hour to produce a thin silicon oxide film on the surface of the less porous layer and the wall surfaces of the pores located near that surface. Subsequently, the silicon wafer was dipped into a 1.25% HF aqueous solution for 30 seconds to remove the very thin oxide film formed on the surface of the less porous layer and the wall surfaces of the pores located near that surface. The silicon wafer was then washed well with water and dried. Thereafter, the silicon wafer was placed in an epitaxial growth system and heat-treated at 1,100° C. in a hydrogen atmosphere by adding silane gas at a very small rate to close almost all the pores on the surface of the low porosity porous silicon. Then, a single crystal silicon film was formed on the less porous silicon having close pores to an average thickness of 310 nm±5 nm by adding dichlorosilane as a silicon source gas to the hydrogen gas. The silicon wafer was then taken out of the epitaxial growth system and placed in an oxidizing furnace. Thus, the surface of the single crystal silicon film was oxidized to produce a 200 nm thick silicon oxide film by means of a combustion gas of oxygen and hydrogen. As a result of oxidation, the single crystal silicon film had a thickness of 210 nm. Meanwhile, a second silicon wafer was subjected to a thermal oxidation process to form a 200 nm thick silicon oxide film on the entire surface thereof, and each of the wafers was subjected to a wet cleansing operation that is popularly used in a silicon device process to produce a clean surface. Then, the two silicon wafers were bonded together. The silicon wafer assembly obtained by bonding the two wafers was placed in a heat treatment furnace, where it was heat-treated at 1,100° C. for 1 hour to enhance the bonding strength at the interface. An atmosphere of a mixture of nitrogen and oxygen was used for the heat treatment. Then, the silicon wafer assembly was separated along the highly porous layer under the fluid wedge effect by applying a high pressure water jet stream to a lateral side of the assembly to expose the porous layer on the single crystal silicon film of the second silicon wafer. It was found that the single crystal silicon film had been transferred onto the second silicon wafer with the silicon oxide film to produce an SOI wafer having a residual porous silicon layer. The silicon oxide film on the rear surface of all the obtained SOI wafers having a residual porous silicon layer was etched in advance by means of hydrofluoric acid, and the SOI wafers were put into a vertical heat treatment furnace as shown in FIG. 10. Gas was made to flow from above to below in the furnace. The wafers were arranged horizontally on a SiC boat as shown in FIG. 9 in such a way that the rear surface of each of the SOI wafers faced the surface of the SOI layer of the SOI wafer located directly below it, and the oppositely disposed surfaces are separated by a gap of about 6 mm, the center of each of the wafers agreeing with the center line of the furnace tube. A commercially available bulk silicon wafer from which the natural silicon film, if any, had been removed was arranged on top of the SOI wafers, using the above-described gap to separate it from the top SOI wafer. After replacing the atmosphere in the furnace with hydrogen, the temperature in the furnace was raised to 1,100° C. and maintained at that level for 4 hours before the temperature was lowered to take out the wafers and observe the film thickness of the SOI of each specimen again.

After the heat treatment, the specimens were observed through an atomic force microscope for surface roughness. The root mean square of surface roughness (Rrms) of each of the specimens was 0.12 nm for a 1 μm square area and 0.34 nm for a 50 μm square area, thereby indicating that the specimens had been smoothed to the level of commercially available silicon wafers. After the heat treatment, the boron concentration of the single crystal silicon film of each of the specimens was observed by secondary ion mass spectrography (SIMS) to find that the boron concentration had been reduced to less than $5 \times 10^{15}/cm^3$ to prove that the specimen could feasibly be used for manufacturing electronic devices.

As described above by way of examples, according to the invention, the surface of a semiconductor article having a single crystal silicon film can be smoothed to the level of commercially available silicon wafers, minimizing the reduction in the film thickness of the single crystal silicon film on the surface to practically nil without introducing crystal defects such as a distorted layer that may be produced by an ordinary smoothing operation. In short, with a method and an apparatus according to the invention, the surface of a semiconductor article such as an SOI substrate can be smoothed and the boron concentration of the article can be reduced without damaging the uniform film thickness of each and every wafer.

Additionally, the above-described effect of minimizing the reduction in the film thickness can be ensured when a plurality of semiconductor articles comprising a single crystal silicon film formed on an insulator are collectively processed without increasing deviations in each and among all of the articles. Thus, for example, the surface of a number of SOI substrates can be smoothed and their boron concentration can be reduced collectively, maintaining the uniformity of film thickness.

Still additionally, since the temperature level involved in a method according to the invention is the one that is normally observed in ordinary semiconductor processes, the present invention can be applied to existing semiconductor heat treatment processes for manufacturing semiconductor devices. The heat treatment process to be conducted for a method according to the invention can be used in conjunction with some other appropriate process.

Finally, a method according to the invention can smooth local single crystal regions such as bottom areas of recesses produced on the surface of a semiconductor article as a result of surface treatment that can not be smoothed by ordinary polishing.

What is claimed is:

1. A method for heat-treating an SOI substrate having a silicon surface comprising a step of:

heat-treating said SOI substrate in a hydrogen-containing reducing atmosphere, with keeping said SOI substrate in a state disposed opposite to a planar surface comprising a material comprised of a non-oxidized silicon as a main component with a predetermined distance separating them.

2. A method for heat-treating an SOI substrate having a silicon surface according to claim 1, wherein said material is selected from a group consisting of silicon, silicon carbide and silicon nitride.

3. A method for heat-treating an SOI substrate having a silicon surface according to claim 1, wherein said silicon surface is an unpolished surface.

4. A method for heat-treating an SOI substrate having a silicon surface according to claim 1, wherein said silicon surface has a surface roughness attributable to a porous silicon layer.

5. A method for heat-treating an SOI substrate having a silicon surface according to claim 1, wherein said silicon surface has a surface roughness attributable to microcavities.

6. A method for heat-treating an SOI substrate having a silicon surface according to claim 1, wherein said SOI substrate has a buried insulation film obtained as a result of oxygen ion implantation and heat treatment.

7. A method for heat-treating an SOI substrate having a silicon surface according to claim 1, wherein said planar surface is obtained by removing a natural oxide film.

8. A method for heat-treating an SOI substrate having a silicon surface according to claim 1, wherein a plurality of said SOI substrates are arranged so as to have their respective said silicon surfaces arranged in parallel with each other.

9. A method for heat-treating an SOI substrate having a silicon surface according to claim 8, wherein each of said SOI substrates is arranged to face a rear surface of an adjacent SOI substrate from which rear surface any oxide film is removed.

10. A method for heat-treating an SOI substrate having a silicon surface according to claim 8, wherein any adjacent said SOI substrates are arranged with their silicon surfaces facing each other.

11. A method for heat-treating an SOI substrate having a silicon surface according to claim 1, wherein a plurality of SOI substrates are arranged coaxially at predetermined intervals and directed to a same direction; and a dummy substrate having said plane surface is arranged to face said silicon surface of the leading SOI substrate.

12. A method for heat-treating an SOI substrate having a silicon surface according to claim 1, wherein said SOI substrate is placed in a container having an inner wall surface of non-oxidized silicon.

13. A method for heat-treating an SOI substrate having a silicon surface according to claim 1, wherein said SOI substrate is placed in a container comprising an outer tube comprised of silicon oxide and an inner tube having an inner surface comprised of non-oxidized silicon.

14. A method for heat-treating an SOI substrate having a silicon surface according to claim 13, wherein hydrogen gas is supplied into said inner tube and exhausted from said inner tube by way of a flow path between the inner tube and the outer tube.

15. A method for heat-treating an SOI substrate having a silicon surface according to claim 1, wherein a plurality of said SOI substrates are supported by a support member having a surface comprising non-silicon oxide so as to be arranged in parallel with each other in a container having an inner wall surface also comprising non-oxidized silicon.

16. A method for heat-treating an SOI substrate having a silicon surface according to claim 1, wherein the root mean square of surface roughness in 1 μm square area of said silicon surface is made to be not greater than 0.4 nm after the heat treatment.

17. A method for heat-treating an SOI substrate having a silicon surface according to claim 1, wherein a plurality of said SOI substrates, each having a silicon surface, are arranged coaxially in parallel with each other at predetermined intervals to face a same direction and a dummy substrate having at least a non-oxidized silicon surface is arranged foremost to face the silicon surface of the leading SOI substrate.

18. A method for heat-treating an SOI substrate having a silicon surface according to claim 1, wherein said SOI substrate has an Si layer formed by epitaxial growth.

19. A method for heat-treating an SOI substrate having a silicon surface according to claim 1, wherein the SOI layer of said SOI substrate has a thickness of not greater than 450 nm.

20. A method for heat-treating an SOI substrate having a silicon surface according to claim 1, wherein a flow rate of gas running near and in parallel with a principal surface of said SOI substrate is made smaller than a flow rate of gas running perpendicularly relative to a principal surface in an outer peripheral area of the SOI substrate.

21. A method for heat-treating an SOI substrate having a silicon surface according to claim 20, wherein the flow rate of gas running near the principal surface of said SOI substrate is made practically equal to 0.

22. A method for heat-treating an SOI substrate having a silicon surface according to claim 1, wherein a silicon oxide film of a rear surface of said SOI substrate is removed to expose the non-oxidized silicon of the rear surface.

23. A method for heat-treating an SOI substrate having a silicon surface according to claim 1, wherein a plurality of said SOI substrates are arranged such that each SOI substrate is placed on a tray having a rear surface of non-oxidized silicon with the SOI layer facing upward and vis-a-vis the rear surface of the tray located immediately thereabove.

24. A method for heat-treating an SOI substrate having a silicon surface according to claim 1, wherein a countersurface constituting member containing silicon carbide as principal ingredient is arranged opposite to the SOI substrate with hydrogen gas interposed therebetween for heat treatment.

25. A method for heat-treating an SOI substrate having a silicon surface according to claim 1, wherein the hydrogen-containing reducing atmosphere substantially contains hydrogen or hydrogen and inert gases.

26. A method for heat-treating an SOI substrate having a silicon surface according to claim 1, wherein said hydrogen-containing reducing atmosphere shows a dew point not higher than −92° C.

27. A method for heat-treating an SOI substrate having a silicon surface according to claim 1, wherein said SOI substrate is supported by a member containing Si, SiC or SiN at least on its surface as the principal ingredient.

28. A method for heat-treating an SOI substrate having a silicon surface according to claim 1, wherein said SOI substrate is so arranged in a container as to make its principal surface stand perpendicular relative to a main stream of gas introduced into the container.

29. A method of preparing an SOI substrate, which comprises the step of:

smoothing a surface of the SOI substrate by a heat treatment method according to claim 1.

30. A method of preparing an SOI substrate, which comprises the step of:

reducing an impurity concentration of an SOI layer of the SOI substrate by a heat treatment method according to claim 1.

* * * * *

UNITED STATES PATENT AND TRADEMARK OFFICE
CERTIFICATE OF CORRECTION

PATENT NO. : 6,171,982 B1
DATED : January 9, 2001
INVENTOR(S) : Nobuhiko Sato

It is certified that error appears in the above-identified patent and that said Letters Patent is hereby corrected as shown below:

Column 4,
Line 23, "same" should read -- the same --.

Column 5,
Line 32, "¶ heat-treating" should read -- ¶ heat-treating --;
Line 40, "¶ arranging" should read -- ¶ arranging --;
Line 42, "¶ heat-treating" should read -- ¶ heat-treating --; and
Line 61, "of a" should read -- of --.

Column 6,
Line 5, "of a" should read -- of --; and
Line 49, "4 a" should read -- 4 as a --.

Column 7,
Line 8, "of" should be deleted; and
Line 62, "to" should be deleted.

Column 8,
Line 27, "same" (second occurrence) should be deleted.
Line 53, "increased" should read -- increases --.

Column 11,
Line 10, "becomes" should be deleted; and
Line 54, "they" should read -- where they --.

Column 12,
Line 64, "surface" should be deleted.

Column 13,
Line 32, "c" should be deleted.

Column 14,
Line 41, "first" should read -- a first --.

Column 17,
Line 63, "exposed" should read -- expose --.

Column 21,
Line 59, "specimen" sholud read -- specimens --; and
Line 67, "electron ic" should read -- electronic --.

UNITED STATES PATENT AND TRADEMARK OFFICE
CERTIFICATE OF CORRECTION

PATENT NO. : 6,171,982 B1
DATED : January 9, 2001
INVENTOR(S) : Nobuhiko Sato

It is certified that error appears in the above-identified patent and that said Letters Patent is hereby corrected as shown below:

Column 25,
Line 2, "atomosphere" should read -- atmosphere --.

Column 26,
Line 33, "1pm" should read -- 1 μm --.

Column 29,
Line 60, "above-desribed" should read -- above-described --.

Column 31,
Line 10, "above-desribed" should read -- above-described --.

Column 33,
Line 18, "close" should read -- closed --.

Column 34,
Line 42, "can not" should read -- cannot --.

Signed and Sealed this

Eleventh Day of December, 2001

Attest:

NICHOLAS P. GODICI
Attesting Officer *Acting Director of the United States Patent and Trademark Office*